(12) United States Patent
Agrawal et al.

(10) Patent No.: US 7,378,872 B1
(45) Date of Patent: May 27, 2008

(54) PROGRAMMABLE LOGIC DEVICE ARCHITECTURE WITH MULTIPLE SLICE TYPES

(75) Inventors: Om P. Agrawal, Los Altos, CA (US); Barry Britton, Orefield, PA (US); Xiaojie He, Austin, TX (US); Sajitha Wijesuriya, Macungie, PA (US); Ming H. Ding, San Jose, CA (US); Jun Zhao, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 48 days.

(21) Appl. No.: 11/445,620

(22) Filed: Jun. 2, 2006

(51) Int. Cl.
*H03K 19/177* (2006.01)

(52) U.S. Cl. ............................. 326/41; 326/37; 326/38; 326/39; 326/47

(58) Field of Classification Search ............ 326/37–41, 326/47
See application file for complete search history.

(56) References Cited

U.S. PATENT DOCUMENTS

| | | | |
|---|---|---|---|
| 6,529,040 B1 * | 3/2003 | Carberry et al. | 326/40 |
| 6,603,332 B2 * | 8/2003 | Kaviani et al. | 326/39 |
| 7,111,273 B1 * | 9/2006 | Ganesan et al. | 716/17 |
| 2004/0178818 A1 * | 9/2004 | Crotty et al. | 326/40 |

OTHER PUBLICATIONS

Virtex-E 1.8V Field Programmable Gate Arrays, Production Product Specification, Jan. 16, 2006, pp. 1-54, Xilinx Corporation.

Virtex-4 Family Overview, Preliminary Product Specification, Feb. 10, 2006, pp. 1-9, Xilinx Corporation.
Virtex-II Platform FPGAs: Complete Data Sheet, Product Specification, Mar. 1, 2005, Module 1 and pp. 1-40 of Module 2, Xilinx Corporation.
Stratix II Device Handbook, vol. 1, Apr. 2006, pp. 1-1 to 1-6 and 2-1 to 2-39, Altera Corporation.
U.S. Appl. No. 11/446,542, filed Jun. 2, 2006, Agrawal et al.
U.S. Appl. No. 11/446,351, filed Jun. 2, 2006, Agrawal et al.
Lattice Semiconductor Corporation, LatticeECP/EC Family Data Sheet, Version 02.1, Nov. 2005, 159 pages.
Lattice Semiconductor Corporation, Lattice XP Family Data Sheet, Version 04.2, Mar. 2006, 127 pages.
Altera, Section I. Stratix Device Family Data Sheet, vol. 1, Sep. 2004, 276 pages.
Altera, Section 1, Stratix II Device Family Data Sheet, vol. 1, Jan. 2006, 232 pages.
Xilinx, Virtex-E 1.8 V, Field Programmable Gate Arrays, DS022-2 (v2.8) Jan. 16, 2006, 54 pages.

(Continued)

*Primary Examiner*—Rexford Barnie
*Assistant Examiner*—Jason Crawford
(74) *Attorney, Agent, or Firm*—MacPherson Kwok Chen & Heid LLP; Greg J. Michelson

(57) ABSTRACT

Systems and methods are disclosed herein to provide logic block slice architectures and programmable logic block architectures along with control logic architectures in accordance with embodiments of the present invention. For example, in accordance with an embodiment of the present invention, a programmable logic device includes a plurality of programmable logic blocks, with at least one of the programmable logic blocks having at least a first, a second, and a third logic block slice of different logic block slice types.

17 Claims, 8 Drawing Sheets

OTHER PUBLICATIONS

Xilinx, Virtex-4, Family Overview, DS112, (v1.5) Feb. 10, 2006, 9 pages.
Xilinx, Virtex-II Platform FPGAs: Complete Date Sheet, DS031 (v3.4) Mar. 1, 2005, 318 pages.
Xilinx, Virtex-4, User Guide, UG070 (v1.4) Sep. 12, 2005, 388 pages.
Xilinx, Spartan-3E FPGA Family: Complete Data Sheet, DS312 May 19, 2006, 230 pages.
Xilinx, Spartan-3 FPGA Family: Complete Data Sheet, DS099 Apr. 26, 2006, 206 pages.
U.S. Appl. No. 11/498,646, filed Aug. 3, 2006, Ding et al.

* cited by examiner

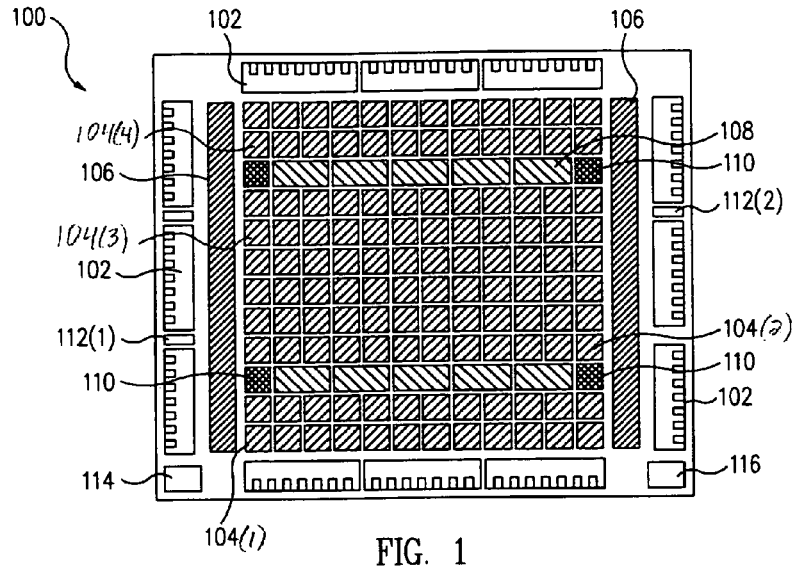
FIG. 1
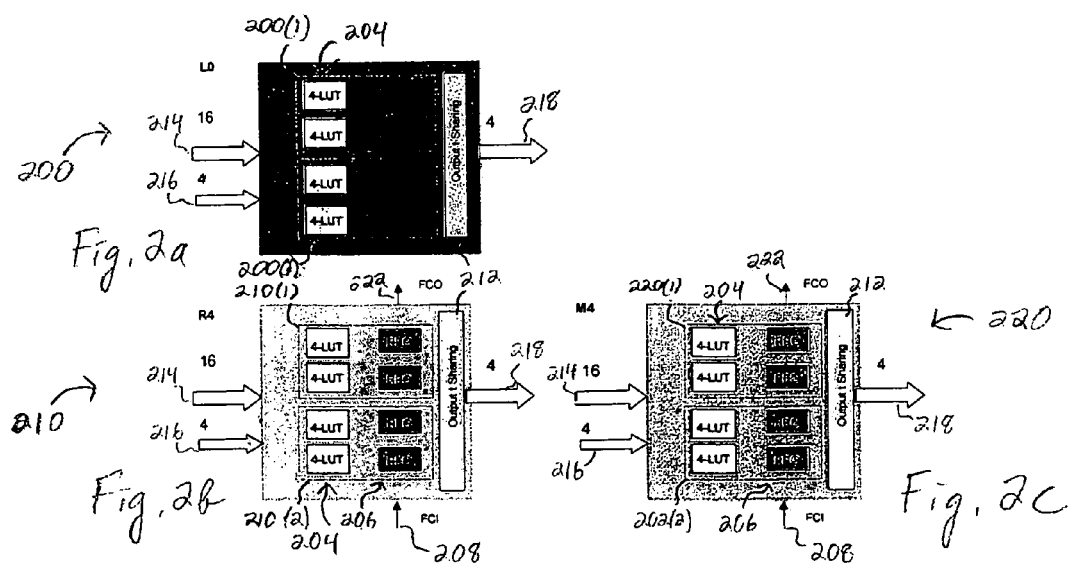
Fig. 2a
Fig. 2b
Fig. 2c

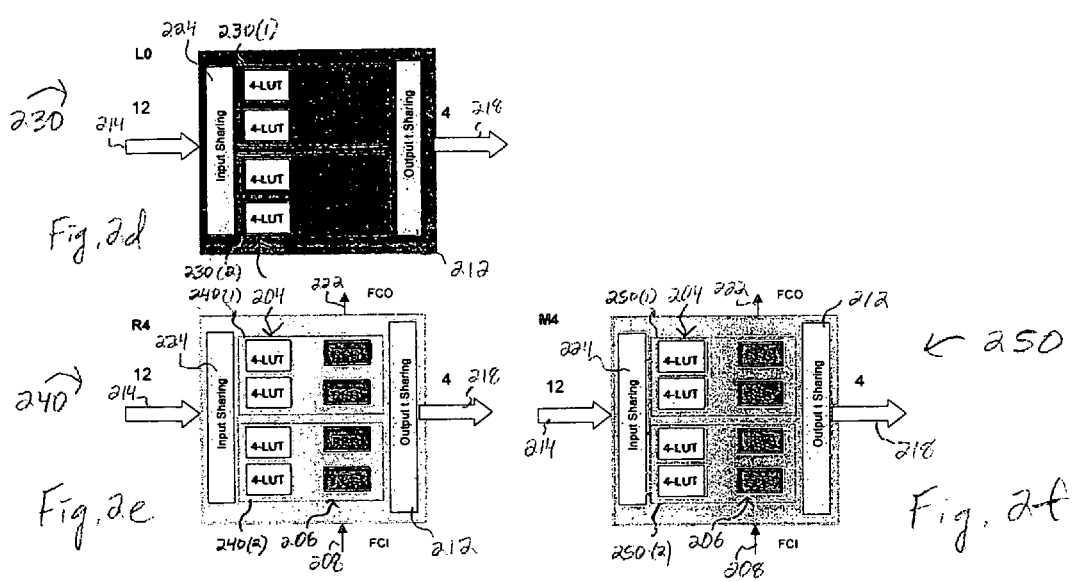

Four Independent 2:1 Muxes    Two Independent 4:1 Muxes    One Independent 8:1 Mux

US 7,378,872 B1

PROGRAMMABLE LOGIC DEVICE ARCHITECTURE WITH MULTIPLE SLICE TYPES

TECHNICAL FIELD

The present invention relates generally to electrical circuits and, more particularly, to programmable logic devices.

BACKGROUND

A programmable logic device, such as a field programmable gate array (FPGA), may be used in a wide variety of applications. For example, a programmable logic device (PLD) offers the advantage of being reprogrammable in the field (e.g., while on the circuit board in its operational environment) to provide the desired functionality.

A typical PLD includes a number of programmable logic blocks (e.g., also referred to in the art as configurable logic blocks, logic array blocks, or programmable function blocks). The programmable logic block architecture may be generally categorized as having a slice-based structure or a block-based structure. A slice may provide, for example, a 2-bit slice structure (e.g., two 4-bit lookup tables (LUTs) plus two registers), with the programmable logic block formed by two slices. A block may provide, for example, eight or more 4-bit LUTs and associated registers, with the programmable logic block formed by the block structure.

A drawback of the conventional PLD is that the programmable logic block architecture is often not optimized for the desired application. For example, the programmable logic blocks are generally homogeneous with each having the same one or two slices or each having the same block structure. Consequently, the programmable logic block architecture is not optimized for the desired application and results in unused resources, larger than necessary die size, and inefficient scaling for providing a larger number of LUTs within the PLD. As a result, there is a need for improved programmable logic block architectures for PLDs.

SUMMARY

In accordance with one embodiment of the present invention, a programmable logic device includes a plurality of programmable logic blocks, wherein at least one of the programmable logic blocks comprises at least a first logic block slice, a second logic block slice, and a third logic block slice; wherein the first logic block slice is a logic block slice type different from the second logic block slice, and the third logic block slice is a logic block slice type different from the first and second logic block slices; and configuration memory adapted to store configuration data to configure the programmable logic blocks.

In accordance with another embodiment of the present invention, a programmable logic device includes a plurality of programmable logic blocks, with each programmable logic block comprising a plurality of logic block slices; wherein at least a first one of the logic block slices is a slice type different from a second one of the logic block slices, and at least a third one of the logic block slices is a slice type different from the first and second ones of the logic block slices within at least one the programmable logic blocks; means for storing configuration data to configure the programmable logic blocks; and means for providing control signals to the programmable logic blocks.

In accordance with another embodiment of the present invention, a method of providing programmable logic blocks within a programmable logic device includes providing each of the programmable logic blocks as a plurality of logic block slices, wherein a first one of the logic block slices is a logic block slice type different from a second one of the logic block slices, and a third one of the logic block slices is a logic block slice type different from the first and second logic block slices within at least one the programmable logic blocks; providing configuration memory for storing configuration data to configure the programmable logic device; and providing control logic to control the programmable logic blocks.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 1 shows a block diagram illustrating an exemplary programmable logic device in accordance with an embodiment of the present invention.

FIGS. 2a-2f show block diagrams illustrating exemplary implementation slice details for the programmable logic device of FIG. 1 in accordance with an embodiment of the present invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 3A:
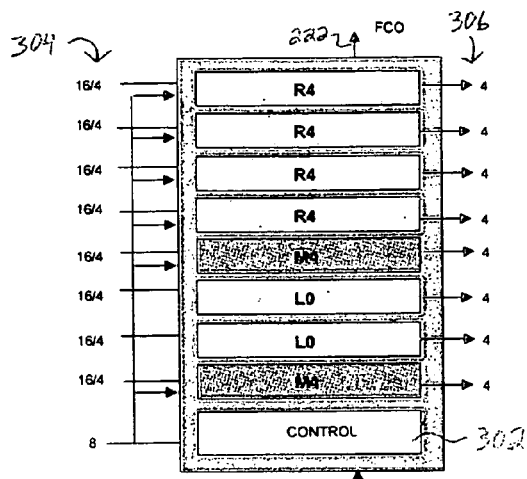
FIGS. 3a-3d show block diagrams illustrating exemplary implementation slice details for a programmable logic block of the programmable logic device of FIG. 1 in accordance with an embodiment of the present invention.
Figure 3B:
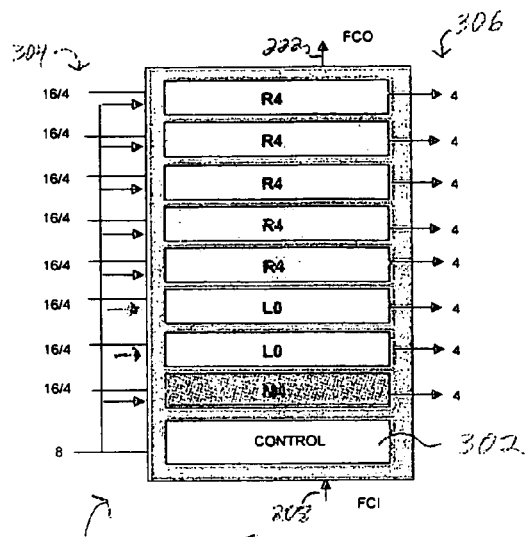
Figure 3C:
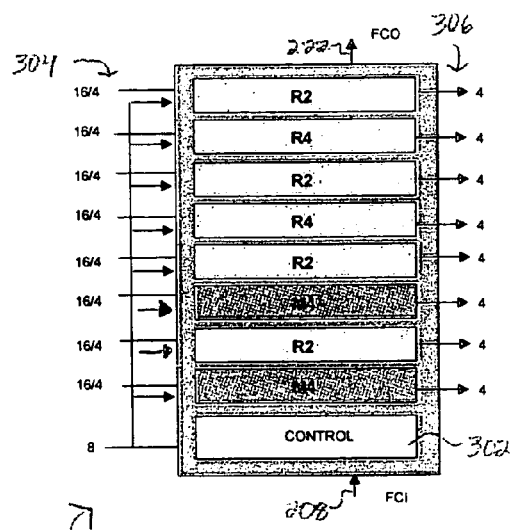
Figure 3D:
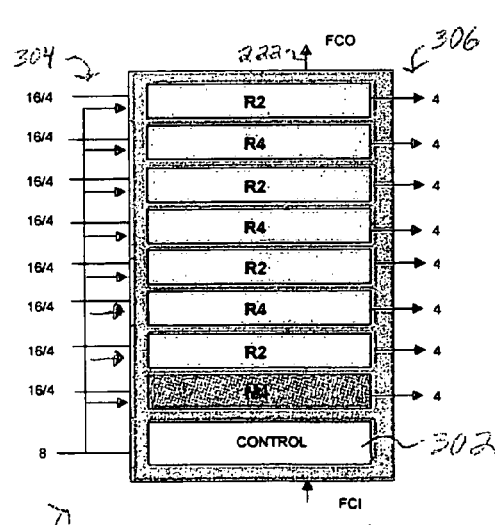

FIG. 1 shows a block diagram illustrating an exemplary programmable logic device (PLD) 100 in accordance with an embodiment of the present invention. PLD 100 (e.g., an FPGA) includes input/output (I/O) blocks 102 and programmable logic blocks 104. I/O blocks 102 provide I/O functionality (e.g., supports one or more I/O and/or memory interface standards) for PLD 100, while programmable logic blocks 104 provide logic functionality (e.g., LUT-based logic and optionally register, arithmetic, and/or memory functionality, as described further herein) for PLD 100.

PLD 100 may also include reprogrammable non-volatile memory 106 (e.g., blocks of EEPROM or flash memory), volatile memory 108 (e.g., block SRAM), clock-related circuitry 110 (e.g., PLL circuits), one or more data ports 112, configuration memory 114, and/or an interconnect 116. It should be understood that the number and placement of the various elements, such as I/O blocks 102, logic blocks 104, non-volatile memory 106, volatile memory 108, clock-related circuitry 110, data port 112, configuration memory 114, and interconnect 116, is not limiting and may depend upon the desired application. Furthermore, it should be understood that the elements are illustrated in block form for clarity and that certain elements, such as configuration memory 114 and interconnect 116, would typically be distributed throughout PLD 100, such as in and between programmable logic blocks 104, to perform their conventional functions (e.g., storing configuration data that configures PLD 100 and providing routing resources, respectively).

Data port 112 may be used for programming non-volatile memory 106 and/or configuration memory 114 of PLD 100, in accordance with one or more embodiments of the present invention and as would be understood by one skilled in the art. For example, data port 112(1) may represent a programming port such as a central processing unit (CPU) port, also referred to as a peripheral data port or a sysCONFIG programming port. Data port 112(2) may represent, for example, a programming port such as a joint test action group (JTAG) port by employing standards such as Institute of Electrical and Electronics Engineers (IEEE)1149.1 or 1532 standards. Data ports 112(1) and 112(2) are not both required, but one or the other or both may be included to receive configuration data and commands. Further details regarding programming may be found in U.S. Pat. No. 6,828,823 and U.S. Patent Application Publication No. 2005-0189962-A1, published Sep. 1, 2005.

As noted herein for conventional programmable logic block architectures, a typical programmable logic block is limited to a maximum of one or two types of slices, which may result in an un-optimized programmable logic block structure that wastes valuable resources (e.g., silicon inefficiency, poor utilization, higher costs, and larger die size). In contrast in accordance with one or more embodiments of the present invention, a programmable logic block architecture is disclosed that provides programmable logic blocks having a large number of slices and a mixture of slice types.

For example, in accordance with an embodiment of the present invention, a programmable logic block is disclosed that provides three or more slices, with each slice being different (e.g., in terms of logic, register, and/or memory functionality). Furthermore for this example in accordance with an embodiment of the present invention, the programmable logic blocks within the PLD may be homogeneous (i.e., each programmable logic block having the same type and number of slices) or the programmable logic blocks may differ in terms of the number and/or types of slices provided (e.g., the programmable logic blocks from row to row may differ from each other for one or more rows within PLD 100, where "row" may represent a row, column, or some number of programmable logic blocks).

For example, FIGS. 2a-2f show block diagrams illustrating exemplary implementation details for logic block slices 200, 210, 220, 230, 240, and 250, respectively, for PLD 100 of FIG. 1 in accordance with an embodiment of the present invention. For example, logic block slices 200, 210, and 220 (labeled and also referred to herein as L0, R4, and M4 logic block slices, respectively) may include a number of LUTs 204 (e.g., four of the four-input LUTs, each labeled 4-LUT to provide 64-bits of SRAM) and a routing circuit 212 (e.g., labeled output sharing).

Logic block slices 200, 210, and 220 each receives LUT input signals 214 (e.g., 16 LUT inputs) and multiplexer control signals 216 (e.g., 4 multiplexer control signals) and each provides output signals 218 (e.g., 4 output signals). Logic block slice 210 may further include registers 206 (e.g., four of registers 206), while logic block slice 220 may further provide distributed memory capability (e.g., read/write capability for LUTs 204 to provide RAM functionality during user mode of operation), as would be understood by one skilled in the art. Logic block slices 210 and 220 further provides carry in and carry out capability as shown by corresponding carry signals 208 and 222 (e.g., labeled FCI and FCO, respectively, to represent exemplary fast carry in and fast carry out capability), as would also be understood by one skilled in the art.

Logic block slices 200, 210, 220, 230, 240, and 250, in accordance with an embodiment of the present invention, may be viewed as representing a dual-slice architecture. For logic block slice 210 of FIG. 2b, for example, a first slice 210(1) and a second slice 210(2) may each include two LUTs 204 and two registers 206. As another example, for logic block slice 200 of FIG. 2a, a first slice 200(1) and a second slice 200(2) may each include simply two LUTs 204. In accordance with other embodiments of the present invention, logic block slices (e.g., logic block slices 200, 210, 220, 230, 240, and/or 250) may simply be a slice or may include more than two slices.

Logic block slices 200, 210, 220, 230, 240, and 250 represent exemplary slices, as discussed further herein, for implementing a programmable logic block architecture of a PLD in accordance with one or more embodiments of the present invention. However, it should be understood that logic block slices 200, 210, 220, 230, 240, and 250 are exemplary and may be modified or varied in accordance with the principles of the present invention. For example, logic block slices 230, 240, and 250 (also labeled and referred to herein as L0, R4, and M4 logic block slices, respectively) are similar to logic block slices 200, 210, and 220, respectively, but further include a routing circuit 224 (e.g., labeled input sharing). Routing circuits 212 and 224 provide, for example, output and input sharing of signals, respectively, within logic block slices 200, 210, 220, 230, 240, and 250 as shown, as would be understood by one skilled in the art.

It should further be understood that routing circuits 212 and/or 224 may be extended to span more than one logic block slice (e.g., logic block slices 200, 210, 220, 230, 240, and 250) to provide common output sharing and/or input sharing, respectively. For example, routing circuit 224 may support and provide input sharing functionality for two or more logic block slices 250 to provide sharing of input signals 214. Furthermore, routing circuit 224 may share input signals 214 among logic block slices 250 being supported or may limit one or more of input signals 214 to a subset of the inputs to certain slices 250(1) within the logic block slices 250 being supported. Similarly, routing circuit 212 may support and provide output sharing functionality for two or more logic block slices 250 to provide sharing of output signals 218.

As another example, logic block slice 210 may be modified to have only one register 206 (rather than two registers 206) within first slice 210(1) and/or second slice 210(2), which may be referred to herein as an "R2" logic block slice. The "R2" logic block slice may also refer to logic block slice 240 having only one register 206 within first slice 240(1) and/or second slice 240(2). Similarly, logic block slice 220 may be modified to have only one register 206 (rather than two registers 206) within first slice 220(1) and/or second slice 220(2), which may be referred to herein as an "M2" logic block slice. The "M2" logic block slice may also refer to logic block slice 250 having only one register 206 within first slice 250(1) and/or second slice 250(2). The exemplary logic block slices discussed in reference to FIGS. 2a-2f, in general, may provide increased functional flexibility (e.g., logic, ripple (e.g., for arithmetic), and/or RAM), depending upon the logic block slices implemented within the PLD, with logic block slices L0, R2, R4, M2, and M4 arranged roughly in order of offering the least to the most functional flexibility.

It should be noted that the R2 and M2 logic block slices, having a reduced number of registers relative to corresponding R4 and M4 logic block slices, may provide a more optimized and efficient logic block. For example, the R2 and M2 logic block slices may require fewer data and control input ports and associated output ports and reduce the overall number of input/output signals associated with a programmable logic block. Thus, the R2 and M2 logic block slices may reduce the amount of input/output routing circuitry (e.g., input switch box (ISB) and output switch box (OSB)) of the programmable logic block.

The logic block slices discussed in reference to FIGS. 2a-2f may be used to form a programmable logic block architecture for a PLD in accordance with one or more embodiments of the present invention. For example in accordance with an embodiment of the present invention, the techniques disclosed herein may allow for a smaller die size and more efficient, optimized logic block architecture. As an example, the programmable logic block architecture may be scalable to 200,000 or more LUTs by providing a larger granularity programmable logic block (e.g., 16 or 32 LUTs or more) with an optimized mixture of logic block slice types (e.g., 2 or more types of logic block slices with a percentage allocation of various logic block slice types) and resources to address high density PLD application requirements. A programmable logic block architecture with large granularity may provide certain additional benefits, such as for example minimizing interconnect delay by performing larger functions, reducing the number of logic levels, reducing overall global interconnect resources and optimizing routing resources, reducing overall power requirements, and permitting efficient scaling to higher density PLDs.

For example, FIGS. 3a-3d show block diagrams of exemplary programmable logic blocks 300, 320, 340, and 360, respectively, illustrating exemplary logic block slice implementation details for PLD 100 of FIG. 1 in accordance with an embodiment of the present invention. For example, programmable logic block 300 includes a number of exemplary logic block slices (e.g., eight logic block slices) and control logic 302 for programmable logic block 300. Programmable logic block 300 receives input signals 304, which includes for example LUT input signals 214, multiplexer control signals 216, various other control signals, and carry signals 208 and provides output signals 306 (e.g., output signals 218) and carry signals 222.

For this exemplary implementation, programmable logic block 300 includes four of logic block slices 210, two of logic block slices 220, and two of logic block slices 200. Consequently, programmable logic block 300 includes three different logic block slice types, specifically including logic block slice type percentages as shown in Table 1 for embodiment 1, which provides 100% logic, 75% register, 25% distributed memory, and 75% ripple logic block slice type functionality, with approximately 169 input signals and 33 output signals.

In a similar fashion, exemplary implementations are provided for programmable logic blocks 320, 340, and 360 (corresponding to embodiments 2, 3, and 4 in Table 1). Specifically, programmable logic block 320 includes five of logic block slices 210, one of logic block slice 220, and two of logic block slices 200, which provides 100% logic, 75% register, 12.5% distributed memory, and 75% ripple logic block slice type functionality, with approximately 169 input signals and 33 output signals. Programmable logic block 340 includes two of logic block slices 210, four "R2" versions of logic block slices 210, and two of logic block slices 220, which provides 100% logic, 75% register, 25% distributed memory, and approximately 75% ripple logic block slice type functionality, with approximately 169 input signals and 33 output signals. Programmable logic block 360 includes three of logic block slices 210, four "R2" versions of logic block slices 210, and one of logic block slice 220, which provides 100% logic, 75% register, 12.5% distributed memory, and approximately 75% ripple logic block slice type functionality, with approximately 169 input signals and 33 output signals.

Although programmable logic blocks 300, 320, 340, and 360 are illustrated using logic block slices 200, 210, and 220, this is merely exemplary and not limiting and in accordance with one or more embodiments of the present invention a programmable logic block may be implemented with logic block slices or variations of logic block slices selected, for example, from logic block slices 200, 210, 220, 230, 240, and/or 250 as desired (e.g., depending upon the desired mixture of logic block slices and application requirements). Consequently in accordance with one or more embodiments of the present invention, a PLD may be implemented with one type of programmable logic block, as disclosed herein, to provide a homogeneous programmable logic block architecture having large granular logic blocks (e.g., a large number of logic block slices per logic block), with a mixture of logic block slice types, depending upon the application requirements. Alternatively in accordance with one or more embodiments of the present invention, a PLD may be implemented with different types of programmable logic blocks, as disclosed herein, to provide a heterogeneous programmable logic block architecture having large granular logic blocks (e.g., a large number of logic block slices per logic block), with a differing mixture of logic block slice types and number of each logic block slice type, depending upon the application requirements. Furthermore for example, a family of PLD devices may be offered that provides a varying degree of granularity, different types of logic block slices, and/or a varying mixture percentage of logic block slice types within the programmable logic blocks to provide a range of functionality within the family.

TABLE 1

Exemplary Programmable Logic Block Implementations

| | Embodiment 1 | Embodiment 2 | Embodiment 3 | Embodiment 4 |
|---|---|---|---|---|
| Logic Block Slice Types | L0, R4, M4 | L0, R4, M4 | R2, R4, M4 | R2, R4, M4 |
| Logic Block Slice Type % Distribution | L0 25% R4 50% M4 25% | L0 25% R4 62.5% M4 12.5% | R2 50% R4 25% M4 25% | R2 50% R4 37.5% M4 12.5% |
| Capability | | | | |
| Logic | 100% | 100% | 100% | 100% |
| Wide gating | 100% | 100% | 100% | 100% |
| Multiplexing | 100% | 100% | 100% | 100% |
| Ripple | 75% | 75% | 75% | 75% |
| Distributed Memory | 25% | 12.5% | 25% | 12.5% |

As noted herein in accordance with one or more embodiments of the present invention, a programmable logic block architecture is disclosed that includes a number of logic block slices, which may be implemented as a number of dual-slice blocks to provide the basic building blocks for each programmable logic block. The dual-slice architecture may provide the silicon efficiency of narrow granularity and the performance of wide gating functions, with an optimized input/output port structure (e.g., input/output sharing and reduction in number of input/output ports compared to one or more conventional approaches). The dual-slice architecture may provide optimal logic block slice architecture and functionality for a desired die size and performance to provide a desired mixture of logic, multiplexing, wide gating, ripple, and distributed memory functions.

For example in accordance with one or more embodiments of the present invention, logic block slices 200, 210, and 220 (FIGS. 2a-2c) provide a dual-slice building block with 16 LUT input signals 214 and 4 output signals 218, while logic block slices 230, 240, and 250 (FIGS. 2d-2f) provide a dual-slice building block with 12 LUT input signals 214 and 4 output signals 218. Logic block slices 200, 210, and 220 may be viewed as optimized for performance relative to logic block slices 230, 240, and 250, while logic block slices 230, 240, and 250 may be viewed as optimized for die area (e.g., silicon efficiency) relative to logic block slices 200, 210, and 220. The exemplary functionality and features of logic block slices 200, 210, 220 230, 240, and 250 are provided in Table 2.

TABLE 2

Exemplary logic block slice (LBS) functionality

| | LBS 200 | LBS 210 | LBS 220 | LBS 230 | LBS 240 | LBS 250 |
|---|---|---|---|---|---|---|
| LUTs | 4 LUT-4 | 4 LUT-4 | 4 LUT-4 | 4 LUT-4 | 4 LUT-4 | 4 LUT-4 |
| Registers | 0 | 4 | 4 | 0 | 4 | 4 |
| LUT Inputs | 16 | 16 | 16 | 12 | 12 | 12 |
| Mux Control Inputs | 4 | 4 | 4 | 0 | 0 | 0 |
| Outputs | 4 | 4 | 4 | 4 | 4 | 4 |
| Input/Output Sharing | No/Yes | tcNo/Yes | No/Yes | Yes/Yes | Yes/Yes | Yes/Yes |
| Dist Memory | No | No | Yes | No | No | Yes |
| Mode | Logic | Logic, Ripple | Logic, Ripple, Memory | Logic | Logic, Ripple | Logic, Ripple, Memory |

A dual-sliced based building block for programmable logic blocks of a PLD, in accordance with an embodiment of the present invention, may provide certain advantages over a conventional slice-based building block. For example, Table 3 provides exemplary details for a conventional slice-based and for two exemplary embodiments of the present invention, with embodiments 1 and 2 listed in Table 3 representing for example logic block slice 230, 240, and/or 250 and logic block slice 200, 210, and/or 220, respectively.

As illustrated, embodiment 1 (e.g., implemented with logic block slices 230, 240, and/or 250) may require fewer data input ports to provide a 40% input port savings and fewer data output ports to provide a 67% output port savings, relative to the conventional slice-based example. Similarly, embodiment 2 (e.g., implemented with logic block slices 200, 210, and/or 220) may require fewer data input ports to provide a 20% input port savings and fewer data output ports to provide a 67% output port savings, relative to the conventional slice-based example.

TABLE 3

Exemplary Comparison of Dual Slice and Conventional Architectures

| | Conventional Slice-Based Example | Dual-Slice Based Embodiment 1 | Dual-Slice Based Embodiment 2 |
|---|---|---|---|
| Inputs | 10-per slice | 12-per dual slice | 16-per dual slice |
| Slice granularity | 2-bits | 4-bits per dual slice | 4-bits per dual slice |
| Number of slices (or dual slices) required for 32-LUT block | 16 | 8 | 8 |
| Data Inputs for 32-LUT block | 160 | 96 | 128 |
| Data Input Port savings | | 40% | 20% |
| # of output ports | 6 per slice | 4-per dual slice | 4-per dual slice |
| # of output ports for 32-LUT block | 96 | 32 | 32 |
| Data output port Savings | | 67% | 67% |

As an example in accordance with an embodiment of the present invention, a dual-slice architecture such as logic block slice 230, 240, or 250 may be viewed as providing optimal functionality for area with 12 LUT input signals 214. For example, 12 LUT input signals 214 provided to the dual-slice architecture (e.g., based on logic block slice 230, 240, or 250) may provide functionality as illustrated in Table 4. In Table 4, A, B, C, and D may represent LUT input signals, while M0, M1, M2, and M3 may represent multiplexer control signals. For example for the dual-slice architecture receiving 12 LUT input signals 214, a maximum of three independent 4-input functions may be provided, while for example four 4-input functions may be provided by using input sharing features of the dual-slice architecture.

Figures 4A, 4B, 4C:
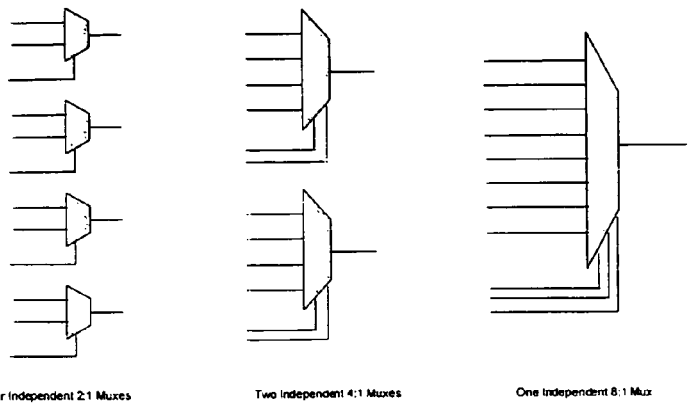
FIGS. 4a-4c show block diagrams illustrating exemplary multiplexer capability for an exemplary dual-slice architecture for a programmable logic block of the programmable logic device of FIG. 1 in accordance with an embodiment of the present invention.

Multiplexer capability may be provided by the dual-slice architecture receiving 12 LUT input signals 214, for example, as illustrated in FIGS. 4a-4c in accordance with one or more embodiments of the present invention. For example as shown, four 2:1 multiplexers (muxes), two 4:1 multiplexers, or one 8:1 multiplexer (mux) may be supported.

TABLE 4

Exemplary Logic Block Slice Functionality

| 3-Input Function | 4-Input Function | 5-Input Function | 6-Input Function | 7-Input Function |
|---|---|---|---|---|
| | | Number of Input Functions | | |
| Four 3-Input Functions | Three 4-Input Functions | Two 5-Input Functions | One 6-Input Function | One 7-Input Function |
| A0, B0, C0 | A0, B0, C0, D0 | A0, B0, C0, D0, M0 | A0, B0, C0, D0 (A1, B1, C1, D1), M0 (M2), M1 | A0, B0, C0, D0, (A1, B1, C1, D1), M0 (M2) M1, M3 |
| M1, M0, D0 | A1, B1, C1, D1 | A1, B1, C1, D1, M1 | | May require 2 dual slices |
| A1, B1, C1 M3, M2, D1 | M3, M2, M1, M0 | | | |

As another example in accordance with an embodiment of the present invention, a dual-slice architecture such as logic block slice 200, 210, or 220 may be viewed as providing optimal functionality for performance with 16 LUT input signals 214. For example, 16 LUT input signals 214 provided to the dual-slice architecture (e.g., based on logic block slice 200, 210, or 220) may provide functionality as illustrated in Table 5. For the dual-slice architecture receiving 16 LUT input signals 214, four independent 4-input functions may be provided and four 2:1 multiplexers (muxes), two 4:1 multiplexers, or one 8:1 multiplexer may be provided. However, four LUT input signals 214 may not be fully utilized, but this may be an improvement relative to conventional slice-based approaches that may not utilize 8 or more input signals for multiplexer functionality when configured in a cascaded slice arrangement.

TABLE 5

Exemplary Logic Block Slice Functionality

| 3-Input Function | 4-Input Function | 5-Input Function | 6-Input Function | 7-Input Function |
|---|---|---|---|---|
| | | Number of Input Functions | | |
| Four 3-Input Functions | Four 4-Input Functions | Two 5-Input Functions | One 6-Input Function | One 7-Input Function |
| A0, B0, C0 | A0, B0, C0, D0 | A0, B0, C0, D0, M0 | A0, B0, C0, D0 (A1, B1, C1, D1), M0 (M2), M1 | A0, B0, C0, D0, (A1, B1, C1, D1), M0 (M2), M1, M3 |
| M1, M0, D0 | A1, B1, C1, D1 | A1, B1, C1, D1, M1 | | May require 2 dual slices |
| A1, B1, C1 M3, M2, D1 | A2, B2, C2, D2 A3, B3, C3, D3 | | | |

Tables 6 and 7 further provide exemplary functionality for logic block slices 230, 240, and 250 and logic block slices 200, 210, and 220, respectively. For example, Table 6 provides exemplary capability for a dual-slice architecture having 12 LUT input signals 214 for an exemplary programmable logic block having one, two, four, and eight dual-slice blocks. As illustrated, wide multiplexing and wide gating capability is provided along with arithmetic capability in ripple mode (e.g., use of 2 LUTs in dynamic arithmetic mode for each dual slice). Distributed memory capability is also provided, for example, for single port RAM (SPR) and dual port RAM (DPR). Similarly for example, Table 7 provides exemplary capability for a dual-slice architecture having 16 LUT input signals 214 for an exemplary programmable logic block having one, two, four, and eight dual-slice blocks (e.g., where eight dual-slice blocks functions as a 32-LUT block, that is one whole programmable logic block for this example).

TABLE 6

Exemplary Logic Block Slice Functionality

| | One Dual Slice (⅛ Block) | Two Dual Slices Combined (¼ Block) | Four Dual Slices Combined (½ Block) | Eight Dual Slices (One Whole Block) |
|---|---|---|---|---|
| Logic (Wide Gating Capability) | Four 3-LUT, Three 4-LUT, Four 4-LUT (with sharing), Two 5-LUT, One 6-LUT | Eight 3-LUT, Six 4-LUT, Eight 4-LUT (with sharing), Four 5-LUT, Two 6-LUT, One 7-LUT | Sixteen 3-LUT, Twelve 4-LUT, Sixteen 4-LUT (with sharing), Eight 5-LUT, Four 6-LUT, Two 7-LUT, One 8-LUT | Thirty two 3-LUT, Twenty four 4-LUT, Thirty two 4-LUT (with sharing), Sixteen 5-LUT, Eight 6-LUT, Four 7-LUT, Two 8-LUT, One 9-LUT |
| Maximum Wide Gating Capability | One 6-LUT | One 7-LUT | One 8-LUT | One 9-LUT |
| Registers | 2/4 | 6/8 | 12/16 | 24/24 |
| Multiplexer Capability | Four 2:1 Muxes, Two 4:1 Muxes, One 8:1 Mux | Eight 2:1 Muxes, Four 4:1 Muxes, Two 8:1 Muxes, One 16:1 Mux | Sixteen 2:1 Muxes, Eight 4:1 Muxes, Four 8:1 Muxes, Two 16:1 Muxes, One 32:1 Mux | Thirty two 2:1 Muxes, Sixteen 4:1 Muxes, Eight 8:1 Muxes, Four 16:1 Muxes, Two 32:1 Muxes, One 64:1 Mux |
| Maximum Wide Multiplexer Capability | 8:1 Mux | 16:1 Mux | 32:1 Mux | 64:1 Mux |
| Distributed Memory Capability | 16 by 4 SPRAM, 16 by 2 DPRAM | 16 by 8 SPRAM, 16 by 4 DPRAM | Depending upon application requirements | Depending upon application requirements |
| Arithmetic Capability | 4 LUTs with Ripple support | 8 LUTs with Ripple support | 16 LUTs with Ripple support | 24 LUTs with Ripple support |

TABLE 7

Exemplary Logic Block Slice Functionality

| | One Dual Slice (⅛ Block) | Two Dual Slices Combined (¼ Block) | Four Dual Slices Combined (½ Block) | Eight Dual Slices (One Whole Block) |
|---|---|---|---|---|
| Logic (Wide Gating Capability) | Four 3-LUT, Three 4-LUT, Four 4-LUT, Two 5-LUT, One 6-LUT | Eight 3-LUT, Six 4-LUT, Eight 4-LUT, Four 5-LUT, Two 6-LUT, One 7-LUT | Sixteen 3-LUT, Twelve 4-LUT, Sixteen 4-LUT, Eight 5-LUT, Four 6-LUT, Two 7-LUT, One 8-LUT | Thirty two 3-LUT, Twenty four 4-LUT, Thirty two 4-LUT, Sixteen 5-LUT, Eight 6-LUT, Four 7-LUT, Two 8-LUT, One 9-LUT |
| Maximum Wide Gating Capability | One 6-LUT | One 7-LUT | One 8-LUT | One 9-LUT |
| Registers | 2/4 | 6/8 | 12/16 | 24/24 |
| Multiplexer Capability | Four 2:1 Muxes, Two 4:1 Muxes, One 8:1 Mux | Eight 2:1 Muxes, Four 4:1 Muxes, Two 8:1 Muxes, One 16:1 Mux | Sixteen 2:1 Muxes, Eight 4:1 Muxes, Four 8:1 Muxes, Two 16:1 Muxes, One 32:1 Mux | Thirty two 2:1 Muxes, Sixteen 4:1 Muxes, Eight 8:1 Muxes, Four 16:1 Muxes, Two 32:1 Muxes, One 64:1 Mux |
| Maximum Wide Multiplexer Capability | 8:1 Mux | 16:1 Mux | 32:1 Mux | 64:1 Mux |
| Distributed Memory Capability | 16 by 4 SPRAM, 16 by 2 DPRAM | 16 by 8 SPRAM, 16 by 4 DPRAM | Depending upon application requirements | Depending upon application requirements |
| Arithmetic Capability | 4 LUTs with Ripple support | 8 LUTs with Ripple support | 16 LUTs with Ripple support | 24 LUTs with Ripple support |

Figure 5A:
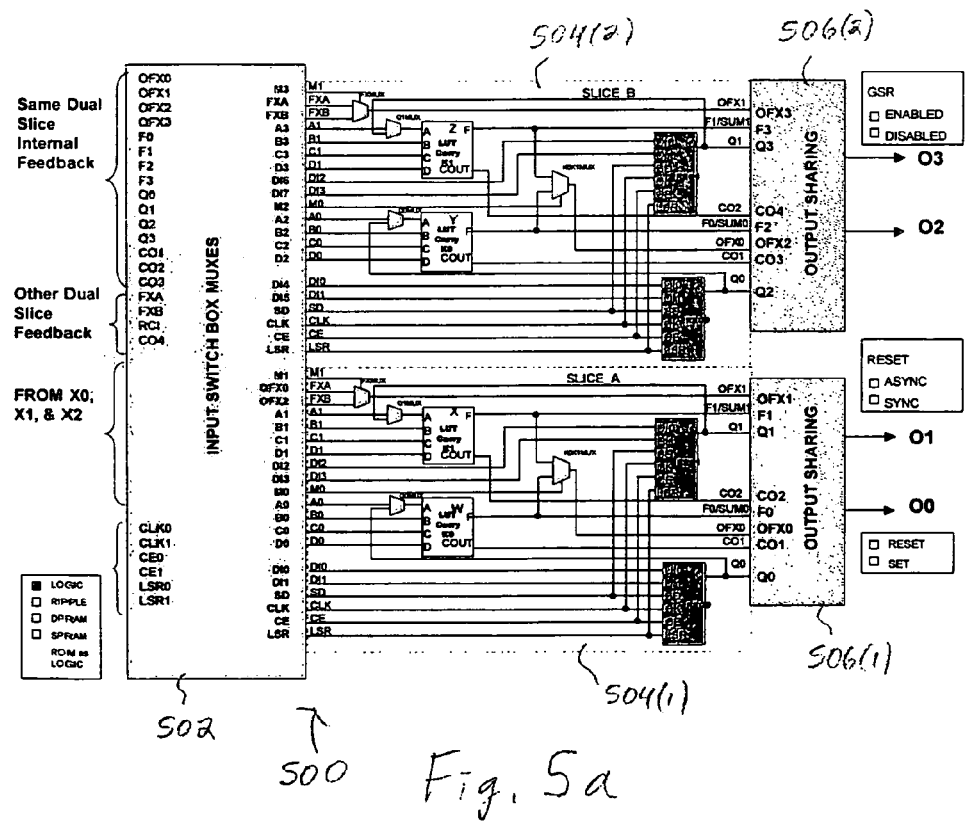
FIGS. 5a-5b show block diagrams illustrating exemplary dual-slice implementations for a programmable logic block of the programmable logic device of FIG. 1 in accordance with one or more embodiments of the present invention.
Figure 5B:
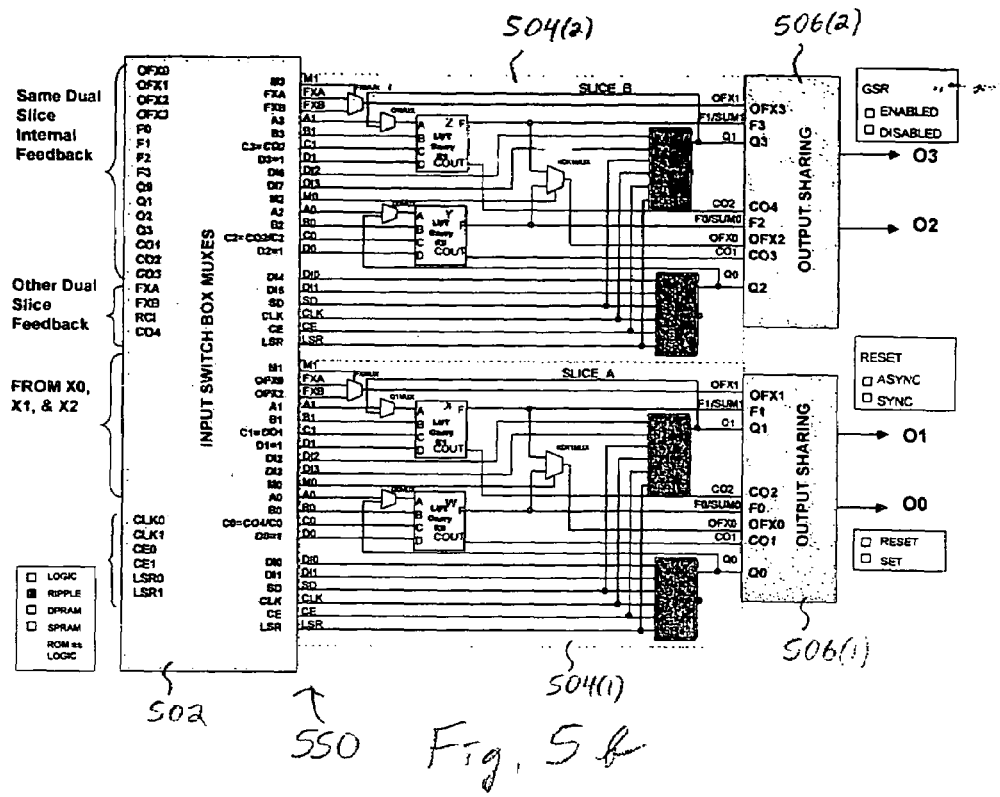

FIGS. 5a-5b show circuits 500 and 550, respectively, which illustrate exemplary dual-slice implementations for PLD 100 of FIG. 1 in accordance with one or more embodiments of the present invention. For example, circuits 500 and 550 each include an input switch 502 (e.g., input sharing 224 which may be implemented as input switch box multiplexers), slices 504(1) and 504(2), and output switches 506(1) and 506(2) (e.g., output sharing 212). Input switch 502 and output switches 506 may correspond, for example, to input sharing 224 and output sharing 212 (FIGS. 2d-2f) and may optionally be expanded to support more than one circuit 500 and/or 550, as discussed similarly in reference to FIG. 2.

Slice 504(1) may correspond, for example, to first slice 240(1) or first slice 250(1) (FIGS. 2e and 2f, respectively), while slice 504(2) may correspond, for example, to second slice 240(2) or second slice 250(2) (FIGS. 2e and 2f, respectively). However, it should be understood that circuits 500 and 550 are specific exemplary implementations and that logic block slices 200, 210, 220, 230, 240, and 250 or variations of these logic block slices may be implemented within circuits 500 and 550, as discussed herein in accordance with one or more embodiments of the present invention.

Circuits 500 and 550 illustrate dual-slice architectures. For example, circuits 500 and 550 may illustrate implementations or configurations for performing logic and ripple, respectively. However, it should be understood that circuits 500 and 550 may also be configured to implement other or complementary operations, for example such as to provide wide gating capability, multiplexer capability, and/or distributed memory capability (if implemented for the particular slice as discussed herein).

Figure 6A:
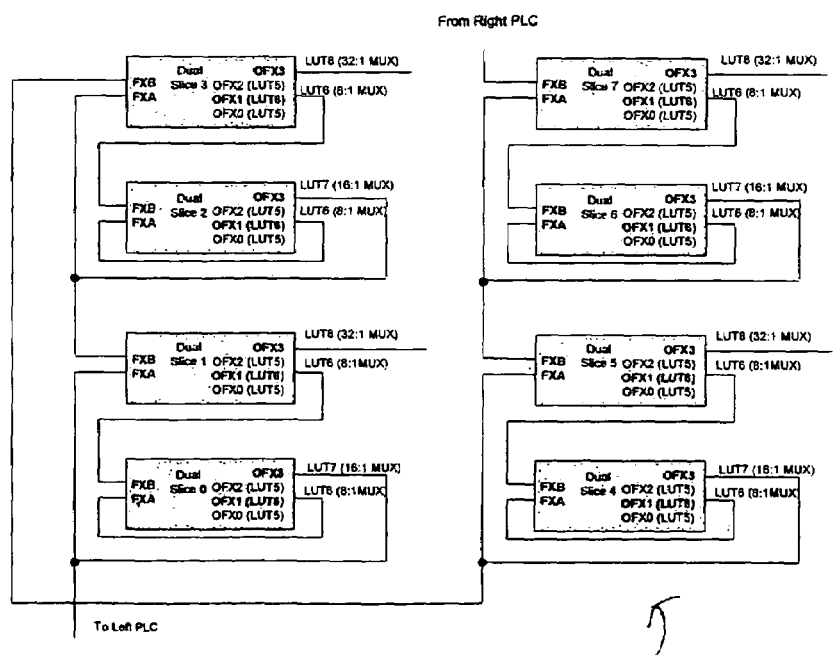
FIGS. 6a-6b show block diagrams illustrating exemplary wide gating for dual-slice implementations of a programmable logic block for the programmable logic device of FIG. 1 in accordance with one or more embodiments of the present invention.
Figure 6B:
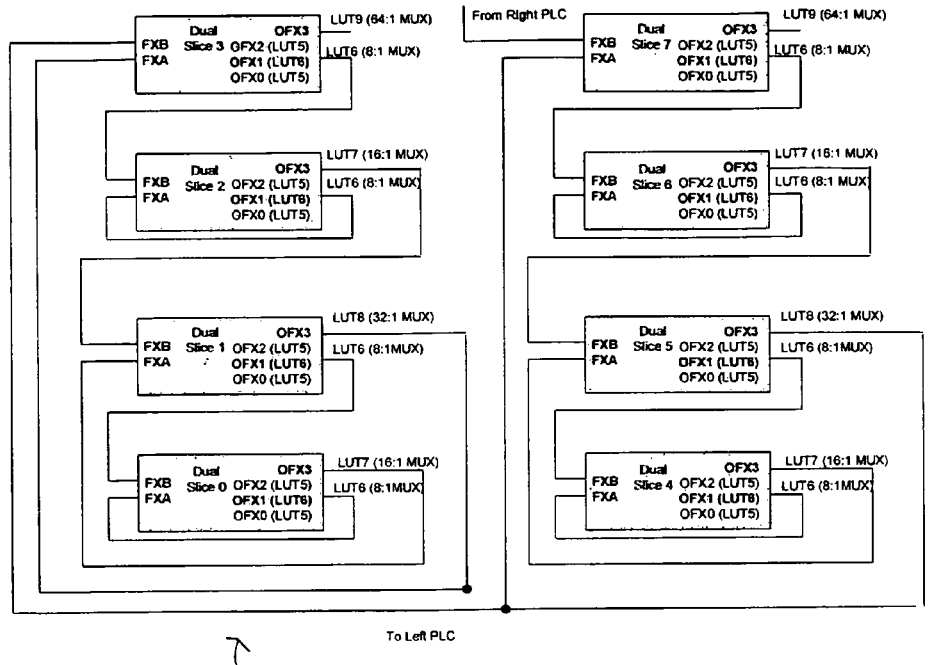

For example, FIGS. 6a-6b show circuits 600 and 650, respectively, illustrating exemplary wide gating implementations for a programmable logic block of PLD 100 of FIG. 1 in accordance with one or more embodiments of the present invention. For example, circuits 600 and 650 each illustrate an exemplary programmable logic block having eight dual-slice blocks (e.g., as discussed in reference to FIGS. 2 through 5) and wide-gating capability via cascading between programmable logic blocks (e.g., also referred to herein as programmable logic cells (PLCs)).

As shown in FIG. 6a for example, circuit 600 may provide eight 8:1 multiplexers and potentially four output signals with 32:1 multiplexers from dual slices labeled dual slice 1, 3, 5, and 7. Dual slices 0 through 3 may be used for one 32:1 multiplexer, while dual slices 4 through 7 may be used for another 32:1 multiplexer.

As shown in FIG. 6b for example, circuit 650 may provide eight 8:1 multiplexers and potentially two output signals with 64:1 multiplexers from dual slices labeled dual slice 3 and 7. If all of the dual slices within circuit 650 are used, a 64:1 multiplexer output may be provided from dual slice 3. Alternatively for this example, dual slices 4 through 7 may be combined with dual slices from a cascaded PLC (e.g., from Right PLC) to form a 64:1 multiplexer.

In accordance with one or more embodiments of the present invention, logic block control architecture may be provided for the programmable logic block architectures and the dual-slice architectures disclosed herein. For example, logic block control architecture embodiments are disclosed herein that may minimize control overhead without compromising packing efficiency, optimize input ports for die size savings, and/or provide block level control signals with the flexibility of individual selection at dual slice or slice level.

Conventional logic block control approaches may consume a large percentage of the overall die, depending on the architecture and density. Furthermore, the conventional approaches may not effectively scale to larger sizes of devices or to a large number of logic blocks within the PLD. In contrast, various embodiments are disclosed herein in accordance with the present invention that may provide optimized logic block control to minimize die size overhead and that is scalable to larger PLD sizes (e.g., 200,000 LUTs or more).

For example, Table 8 provides a comparison between conventional slice-based and block based exemplary logic block implementations relative to an exemplary dual-slice based logic block embodiment of the present invention with respect to control logic. As shown in the table for an exemplary implementation, techniques disclosed herein for one or more embodiments of the present invention may provide certain benefits (e.g., silicon area efficiency and/or flexibility for packing efficiency) and a reduction in the amount of control overhead associated with a programmable logic block. For example, the control logic architecture may be optimized for silicon area efficiency, while providing flexibility of control signal selection such as at the individual dual-slice level.

TABLE 8

Conventional and Exemplary Embodiment Control Overhead

| | Conventional Slice-based | Conventional Block-based | Exemplary Embodiment |
|---|---|---|---|
| Granularity | 2-bit | 10-bit | Dual slice |
| Inputs | 10 + 3 3 controls for 2 Registers | 40 + 10 10 controls for 10 registers | 96 + 8 or 160 + 8 Maximum 8 control signals for up to 32 registers |
| | Individual slice level control | Block level control | Block level control with individual dual slice level control |
| Control overhead | 3/13 (23%) | 10/50 (20%) | 8/104 (7.6%) or 8/168 (4.7%) |

Figures 7A, 7B:
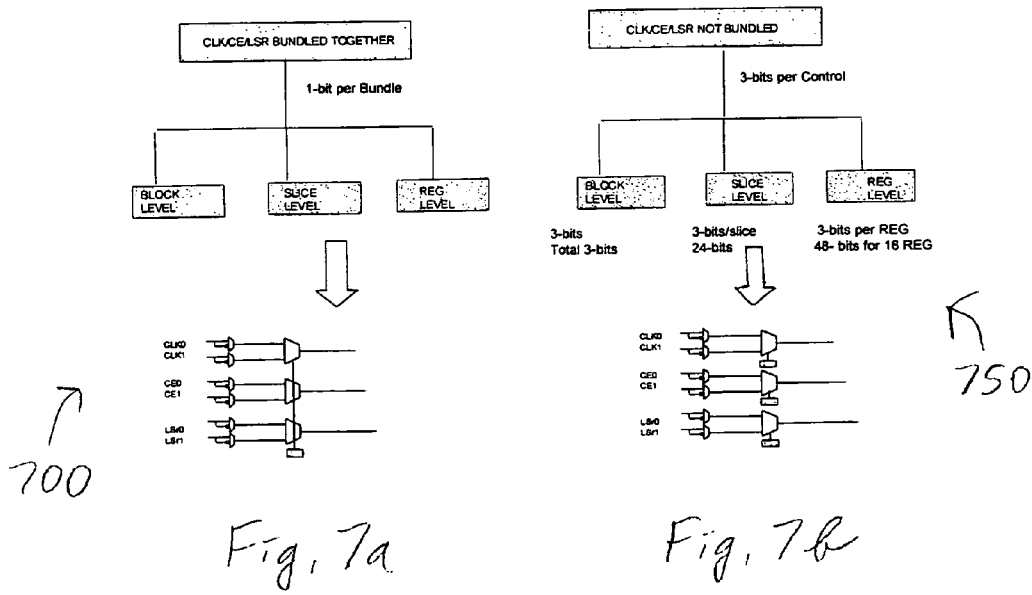
FIGS. 7a-7b show block diagrams illustrating exemplary control logic for dual-slice implementations of a programmable logic block of the programmable logic device of FIG. 1 in accordance with one or more embodiments of the present invention.

FIGS. 7a-7b show block diagrams illustrating exemplary control logic architectures 700 and 750 for dual-slice implementations of a programmable logic block for PLD 100 of FIG. 1 in accordance with one or more embodiments of the present invention. For example, control logic architecture 700 illustrates an exemplary embodiment having various control signals bundled and provided within the programmable logic block. As an example, control signals such as system clocks (CLK), clock enable signals (CE), and local set/reset signals (LSR) may each be grouped or bundled (e.g., with one bit per bundle for each type of control signal) and provided to the block, slice (e.g., dual slice), and/or register level (if implemented) as required.

For example as shown in FIG. 7a, two clock signals (CLK0 and CLK1), two clock enable signals (CE0 and CE1), and two local set/reset signals (LSR0 and LSR1) may be bundled and controlled as shown (e.g., with a one-bit control signal to perform the signal selection via multiplexers). However, this is not limiting and any number of control signals may be bundled together to control the programmable logic block. For example, four clock signals, four clock enable signals, and four local set/reset signals may be bundled and controlled as shown (e.g., with a two-bit control signal to perform the selection via multiplexers).

As another example as shown in FIG. 7b for control logic architecture 750, the control signals may be left unbundled to provide control information to the programmable logic block at the logic block, slice (e.g., dual slice), and/or register (if implemented) level. As an example, the three control signals CLK, CE, and LSR may be provided to the programmable logic block, with for this example one bit required for selection per control signal. For example as shown in FIG. 7b, two clock signals (CLK0 and CLK1), two clock enable signals (CE0 and CE1), and two local set/reset signals (LSR0 and LSR1) may be independently provided and controlled as shown (e.g., with a one-bit control signal to perform the signal selection via multiplexers per control signal type). Therefore, for this example, three bits would be required at the programmable logic block level (block level), with one bit to select between CLK0 and CLK1, one bit to select between CE0 and CE1, and one bit to select between LSR0 and LSR1. If eight dual slices are within the programmable logic block, then with 3-bits per dual slice, 24 bits would be required to provide control signal selection for the dual slices. If sixteen registers are within the programmable logic block (e.g., within the dual slices), then with 3-bits per register, 48 bits would be required to provide control signal selection for the registers, as illustrated in FIG. 7b.

It should be understood that control logic architectures 700 and 750 are not limiting and may be combined as desired. For example in accordance with one or more embodiments of the present invention, the control signals may be selectively bundled or unbundled at the block level, dual-slice level, and/or register level as desired (e.g., depending upon the application or requirements), as would be understood by one skilled in the art.

Figure 8A:
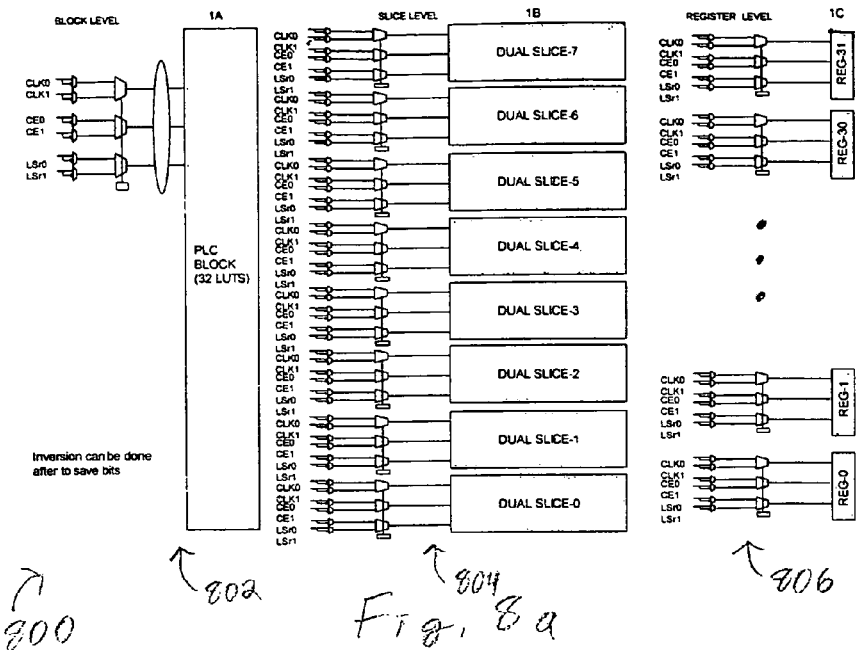
FIGS. 8a-8b show block diagrams illustrating exemplary control logic for a programmable logic block of the programmable logic device of FIG. 1 in accordance with one or more embodiments of the present invention.

As a more specific implementation example, FIG. 8a shows a block diagram illustrating an exemplary control logic implementation for a programmable logic block 800 for PLD 100 of FIG. 1 in accordance with one or more embodiments of the present invention. Programmable logic block 800 is implemented in an exemplary fashion using the techniques discussed in reference to circuit 700 (FIG. 7a). As shown for exemplary control signals CLK, CE, and LSR, these control signals may be bundled at a block level 802, a dual-slice level 804, and/or a register level 806 for programmable logic block 800. Block level 802 represents programmable logic block 800 (e.g., a PLC having 32 LUTs) having an exemplary number of 8 dual slices and 32 registers.

Figure 8B:
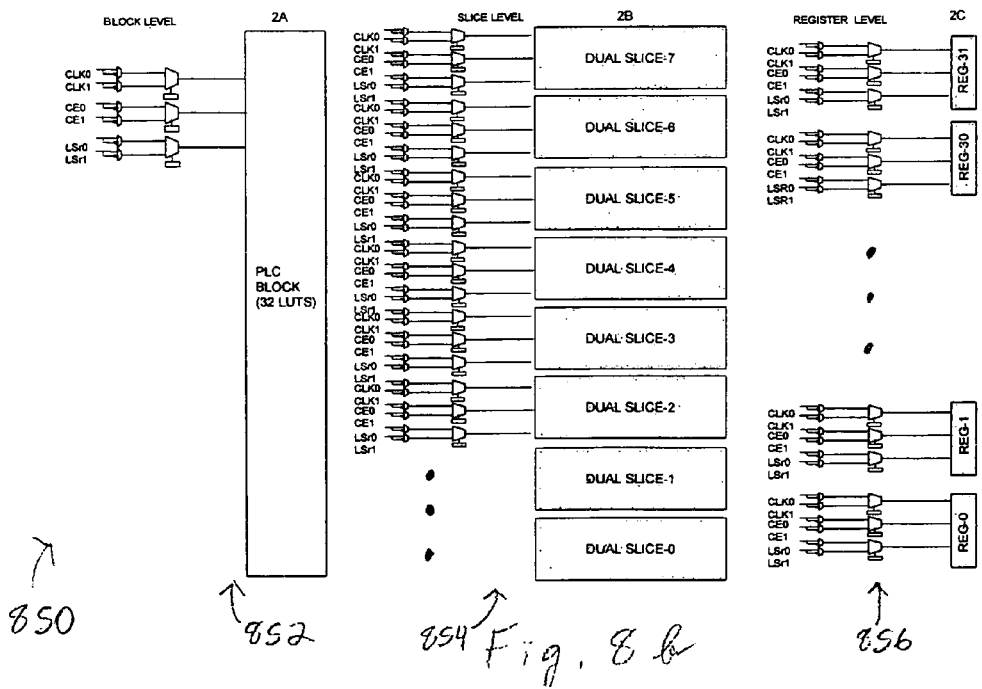

As another more specific implementation example, FIG. 8b shows a block diagram illustrating an exemplary control logic implementation for a programmable logic block 850 for PLD 100 of FIG. 1 in accordance with one or more embodiments of the present invention. Programmable logic block 850 is implemented in an exemplary fashion using the techniques discussed in reference to circuit 750 (FIG. 7b). As shown for exemplary control signals CLK, CE, and LSR, these control signals may be independently provided (i.e., not bundled) at a block level 852, a dual-slice level 854, and/or a register level 856 for programmable logic block 850. Block level 852 represents programmable logic block 850 (e.g., a PLC having 32 LUTs) having an exemplary number of 8 dual slices and 32 registers.

As noted herein, any number and/or type of control signals may be implemented and provided that utilize the techniques disclosed herein in accordance with one or more embodiments of the present invention. For example, FIG. 9 shows a block diagram illustrating exemplary control logic for dual slices of a programmable logic block of PLD 100 of FIG. 1 in accordance with one or more embodiments of the present invention.

Figure 9:
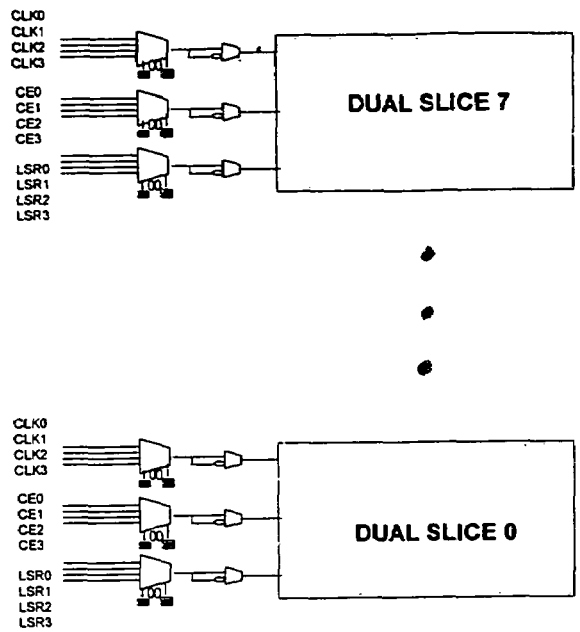
FIGS. 9 and 10 show block diagrams illustrating exemplary control logic for a programmable logic block of the programmable logic device of FIG. 1 in accordance with one or more embodiments of the present invention.

Specifically, FIG. 9 illustrates control logic for eight dual slices, which may be implemented as disclosed herein (e.g., in reference to FIGS. 2-7), with each dual slice having individual selection of the control signals (e.g., as discussed in reference to FIG. 7b).

For this example, four clock signals (CLK0 through CLK3), four clock enable signals (CE0 through CE3), and four local set/reset signals (LSR0 through LSR3) are provided to each dual slice. Each dual slice can independently select the desired clock signal, clock enable signal, and local set/reset signal (e.g., via multiplexers as shown, with multiplexer control signals provided by configuration memory cells as would be understood by one skilled in the art).

Figure 10:
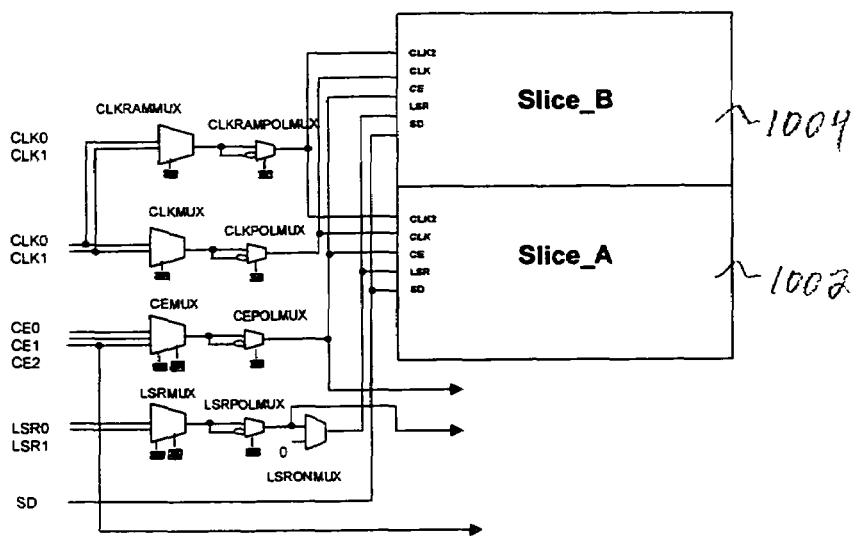

As another example, FIG. 10 shows a block diagram illustrating exemplary control logic for a dual slice of a programmable logic block of PLD 100 of FIG. 1 in accordance with one or more embodiments of the present invention. Specifically, FIG. 10 illustrates control logic for an exemplary dual slice (having a slice 1002 (labeled slice A) and a slice 1004 (labeled slice B)), which may be implemented as disclosed herein (e.g., in reference to FIGS. 2-7), with the dual slice having individual selection of the control signals (e.g., as discussed in reference to FIG. 7b).

For this example, slice 1002 and slice 1004 form a dual slice (e.g., one of seven dual slices that form a 32 LUT programmable logic block), with the dual slice receiving control signals CLK, CE, and LSR (not bundled so as to provide individual dual-slice level control selection flexibility). As an example, two clock signals (CLK0 and CLK1), three clock enable signals (CE0, CE1, and CE2), and two local set/reset signals (LSR0 and LSR1) are provided to the dual slice (e.g., and to the other dual slices within the programmable logic block). For this example, three clock enable signals rather than four may be provided in an optimized fashion if the programmable logic block includes 24 rather than 32 registers.

As illustrated, slices 1002 and 1004 may share the same control signal at input ports labeled CLK2, CLK, CE, LSR, and SD. The control signals may also be provided to other dual slices within the programmable logic block, as illustrated.

Furthermore, the multiplexers may work in unison or shared between the dual slices within the programmable logic block depending upon the mode configured by a user. For example, the multiplexer labeled CLKRAMMUX may be shared by two dual slices in a 16 by 8 SPRAM mode or used by only one dual slice for 16 by 4 SPRAM. Also as discussed in reference to the example in FIG. 9, control signal selection may be performed via multiplexers as shown, with multiplexer control signals provided by configuration memory cells as would be understood by one skilled in the art.

Systems and methods are disclosed herein to provide dual-slice architectures and programmable logic block architectures along with control logic architectures in accordance with embodiments of the present invention. For example, in accordance with an embodiment of the present invention, a homogeneous logic block architecture with a mixture of logic block slice types for high density FPGAs (e.g., 200,000 LUTs or more) is provided. The PLD architecture having a homogeneous logic block architecture with more than 2 types of logic block slices may provide a more efficient logic block architecture with fewer resources wasted and a smaller die size, while providing an optimized block architecture for addressing the majority of application needs.

For example, a dual-slice building block architecture is provided that may be optimized for area and/or performance for high density FPGAs in accordance with one or more embodiments of the present invention. Furthermore, block level control architectures are provided with individual or bundled selection at the dual-slice level to provide optimized input ports and significant die size savings with respect to control overhead.

Embodiments described above illustrate but do not limit the invention. It should also be understood that numerous modifications and variations are possible in accordance with the principles of the present invention. Accordingly, the scope of the invention is defined only by the following claims.

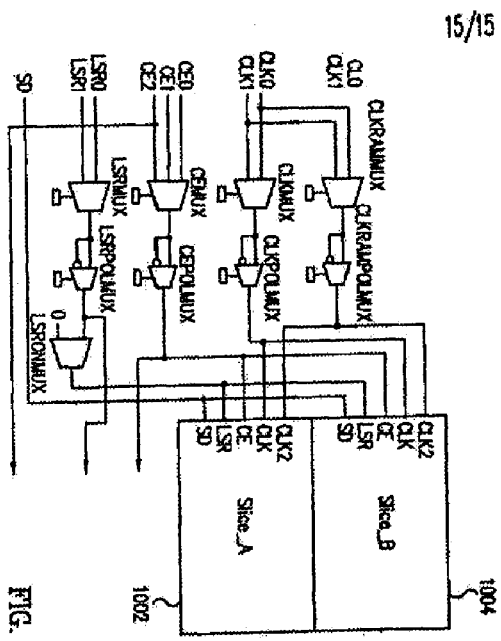
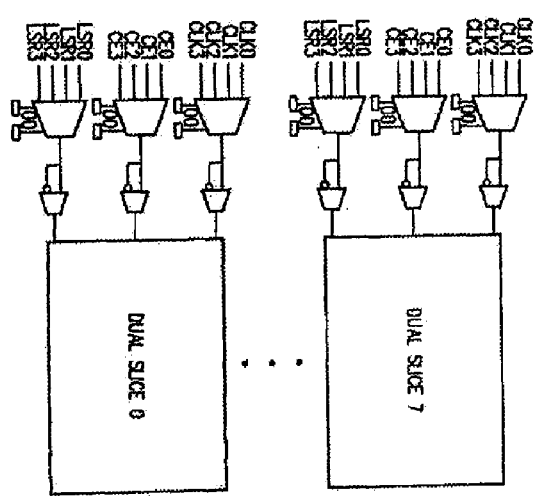

What is claimed is:

1. A programmable logic device comprising:
a plurality of programmable logic blocks, wherein at least one of the programmable logic blocks comprises at least a first logic block slice, a second logic block slice, and a third logic block slice;
wherein the first logic block slice is a logic block slice type different from the second logic block slice, and the third logic block slice is a logic block slice type different from the first and second logic block slices, and wherein the first logic block slice comprises a plurality of lookup tables but no registers or RAM functionality, the second logic block slice comprises a plurality of registers and a plurality of lookup tables but no RAM functionality, and the third logic block slice comprises a plurality of registers and a plurality of lookup tables adapted to provide RAM functionality; and
configuration memory adapted to store configuration data to configure the programmable logic blocks.

2. The programmable logic device of claim 1, wherein the programmable logic blocks are homogeneous within the programmable logic device.

3. The programmable logic device of claim 1, wherein the programmable logic blocks are heterogeneous within the programmable logic device.

4. The programmable logic device of claim 1, wherein the first, second, and third logic block slices each comprise a dual-slice architecture.

5. The programmable logic device of claim 1, wherein the first, second, and third logic block slices each comprise a dual-slice architecture with at least one of an input sharing circuit and an output sharing circuit.

6. The programmable logic device of claim 1, wherein the first, second, and third logic block slices each comprise a dual-slice architecture with at least one of an input sharing circuit and an output sharing circuit, with at least one of the first, second, and third logic block slices providing carry in/out functionality.

7. The programmable logic device of claim 1, further comprising:
a volatile memory block adapted to store information during operation of the programmable logic device;
a non-volatile memory block adapted to store configuration data for transfer to the configuration memory to configure the programmable logic blocks;
input/output blocks adapted to transfer information into and out of the programmable logic device; and
and an interconnect configured based on the configuration data stored in the configuration memory and adapted to provide routing resources between the volatile memory block, input/output blocks, and the programmable logic blocks.

8. The programmable logic device of claim 1, further comprising means for providing control signals to the programmable logic blocks.

9. A programmable logic device comprising:
a plurality of programmable logic blocks, with each programmable logic block comprising a plurality of logic block slices;
wherein at least a first one of the logic block slices is a slice type different from a second one of the logic block slices, and at least a third one of the logic block slices is a slice type different from the first and second ones of the logic block slices within at least one the programmable logic blocks, and wherein the first logic block slice provides lookup table functionality but not register or RAM functionality, the second logic block slice provides register and lookup table functionality but not RAM functionality, and a third one of the logic block slices provides register functionality, lookup table functionality, and RAM functionality;
means for storing configuration data to configure the programmable logic blocks; and means for providing control signals to the programmable logic blocks.

10. The programmable logic device of claim 9, wherein the programmable logic blocks are homogeneous within the programmable logic device.

11. The programmable logic device of claim 9, wherein the programmable logic blocks are heterogeneous within the programmable logic device, with a first one of the programmable logic blocks having a different number of the first ones of the logic block slices than a second one of the programmable logic blocks.

12. The programmable logic device of claim 9, wherein the logic block slices are dual-slice blocks and further comprise at least one of an input sharing circuit, an output sharing circuit, and a carry in/out path.

13. The programmable logic device of claim 9, wherein the programmable logic device forms one of a family of programmable logic devices providing at least one of a programmable logic block granularity variation, differing logic block slice types, and differing percentages of logic block slice types.

14. The programmable logic device of claim 9, further comprising:
- means for storing information during operation of the programmable logic device;
- non-volatile means for storing configuration data for transfer to the configuration memory to configure the programmable logic blocks;
- means for transferring information into and out of the programmable logic device; and
- means for interconnecting the storing means, the transferring means, and the programmable logic blocks, wherein the interconnecting means is configured based on configuration data stored in the configuration memory.

15. A method of providing programmable logic blocks within a programmable logic device, the method comprising:
- providing each of the programmable logic blocks as a plurality of logic block slices, wherein a first one of the logic block slices is a logic block slice type different from a second one of the logic block slices, and a third one of the logic block slices is a logic block slice type different from the first and second logic block slices within at least one the programmable logic blocks;
- performing, with the first logic block slice, lookup table functionality but not register or RAM functionality;
- performing, with the second logic block slice, register and lookup table functionality but not RAM functionality; and
- performing, with the third logic block slice, register functionality, lookup table functionality, and RAM functionality;
- providing configuration memory for storing configuration data to configure the programmable logic device; and
- providing control logic to control the programmable logic blocks.

16. The method of claim 15, wherein the logic block slices are dual-slice blocks and further comprise sharing at least one of input signals and output signals.

17. The method of claim 15, wherein the programmable logic blocks are heterogeneous within the programmable logic device.

* * * * *

UNITED STATES PATENT AND TRADEMARK OFFICE
CERTIFICATE OF CORRECTION

PATENT NO. : 7,378,872 B1
APPLICATION NO. : 11/445620
DATED : May 27, 2008
INVENTOR(S) : Om P. Agrawal et al.

It is certified that error appears in the above-identified patent and that said Letters Patent is hereby corrected as shown below:

The title page showing the illustrative figure should be deleted to be replaced with the attached title page.

The drawing sheets, consisting of Figs. 1-15, should be deleted to be replaced with the drawing sheets, consisting of Figs. 1-15, as shown on the attached page.

Signed and Sealed this

Fifteenth Day of September, 2009

David J. Kappos
*Director of the United States Patent and Trademark Office*

United States Patent
Agrawal et al.

(10) Patent No.: US 7,378,872 B1
(45) Date of Patent: May 27, 2008

(54) PROGRAMMABLE LOGIC DEVICE ARCHITECTURE WITH MULTIPLE SLICE TYPES

(75) Inventors: Om P. Agrawal, Los Altos, CA (US); Barry Britton, Orefield, PA (US); Xiaojie He, Austin, TX (US); Sajitha Wijesuriya, Macungie, PA (US); Ming H. Ding, San Jose, CA (US); Jun Zhao, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 48 days.

(21) Appl. No.: 11/445,620

(22) Filed: Jun. 2, 2006

(51) Int. Cl.
*H03K 19/177* (2006.01)

(52) U.S. Cl. .................... 326/41; 326/37; 326/38; 326/39; 326/47

(58) Field of Classification Search .......... 326/37–41, 326/47
See application file for complete search history.

(56) References Cited

U.S. PATENT DOCUMENTS

| | | | |
|---|---|---|---|
| 6,529,040 B1 * | 3/2003 | Carberry et al. | 326/40 |
| 6,603,332 B2 * | 8/2003 | Kaviani et al. | 326/39 |
| 7,111,273 B1 * | 9/2006 | Ganesan et al. | 716/17 |
| 2004/0178818 A1 * | 9/2004 | Crotty et al. | 326/40 |

OTHER PUBLICATIONS

Virtex-E 1.8V Field Programmable Gate Arrays, Production Product Specification, Jan. 16, 2006, pp. 1-54, Xilinx Corporation.
Virtex-4 Family Overview, Preliminary Product Specification, Feb. 10, 2006, pp. 1-9, Xilinx Corporation.
Virtex-II Platform FPGAs: Complete Data Sheet, Product Specification, Mar. 1, 2005, Module 1 and pp. 1-40 of Module 2, Xilinx Corporation.
Stratix II Device Handbook, vol. 1, Apr. 2006, pp. 1-1 to 1-6 and 2-1 to 2-39, Altera Corporation.
U.S. Appl. No. 11/446,542, filed Jun. 2, 2006, Agrawal et al.
U.S. Appl. No. 11/446,351, filed Jun. 2, 2006, Agrawal et al.
Lattice Semiconductor Corporation, LatticeECP/EC Family Data Sheet, Version 02.1, Nov. 2005, 159 pages.
Lattice Semiconductor Corporation, Lattice XP Family Data Sheet, Version 04.2, Mar. 2006, 127 pages.
Altera, Section I, Stratix Device Family Data Sheet, vol. 1, Sep. 2004, 276 pages.
Altera, Section I, Stratix II Device Family Data Sheet, vol. 1, Jan. 2006, 232 pages.
Xilinx, Virtex-E 1.8 V, Field Programmable Gate Arrays, DS022-2 (v2.8) Jan. 16, 2006, 54 pages.

(Continued)

*Primary Examiner*—Rexford Barnie
*Assistant Examiner*—Jason Crawford
(74) *Attorney, Agent, or Firm*—MacPherson Kwok Chen & Heid LLP; Greg J. Michelson

(57) ABSTRACT

Systems and methods are disclosed herein to provide logic block slice architectures and programmable logic block architectures along with control logic architectures in accordance with embodiments of the present invention. For example, in accordance with an embodiment of the present invention, a programmable logic device includes a plurality of programmable logic blocks, with at least one of the programmable logic blocks having at least a first, a second, and a third logic block slice of different logic block slice types.

17 Claims, 8 Drawing Sheets

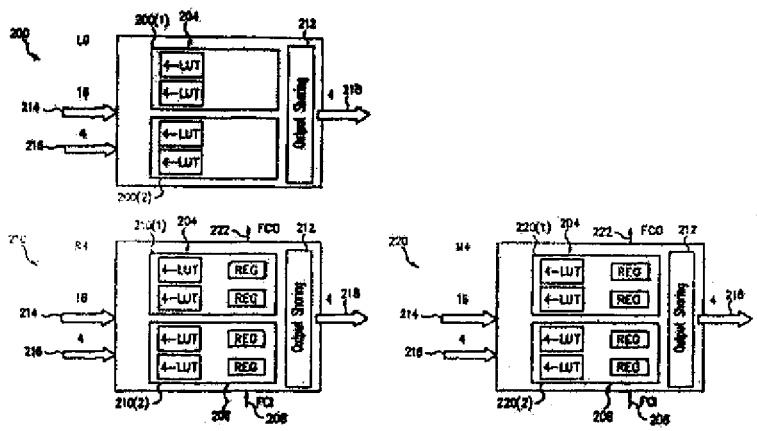

UNITED STATES PATENT AND TRADEMARK OFFICE
CERTIFICATE OF CORRECTION

PATENT NO.        : 7,378,872 B1                                    Page 3 of 17
APPLICATION NO.   : 11/445620
DATED             : May 27, 2008
INVENTOR(S)       : Om P. Agrawal et al.

It is certified that error appears in the above-identified patent and that said Letters Patent is hereby corrected as shown below:

Replace sheet 1 of 15 with the following drawing:

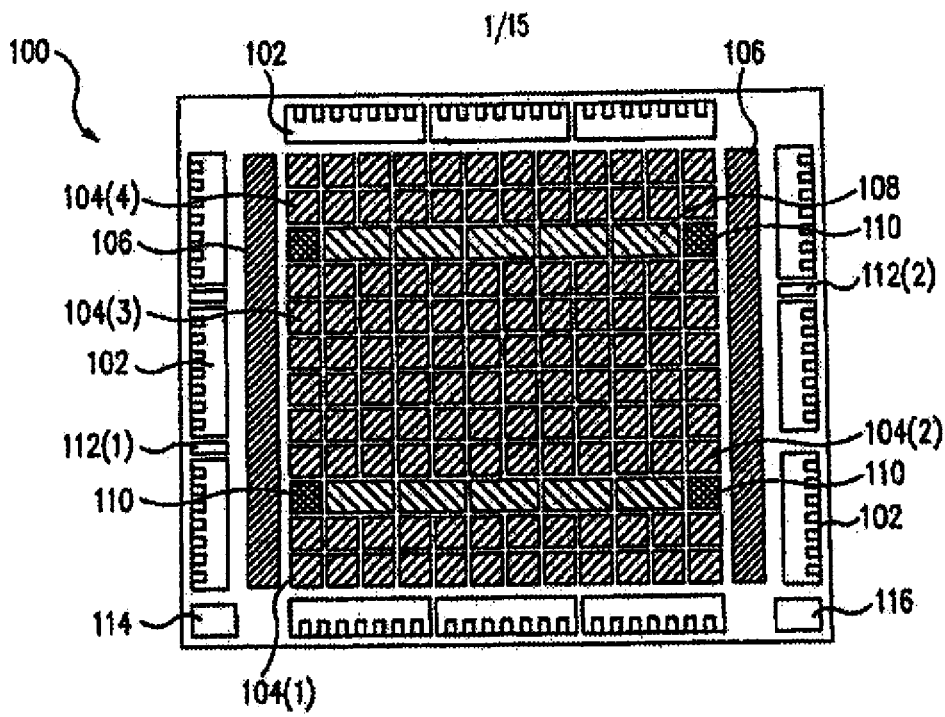

FIG. 1

UNITED STATES PATENT AND TRADEMARK OFFICE
CERTIFICATE OF CORRECTION

PATENT NO. : 7,378,872 B1 Page 4 of 17
APPLICATION NO. : 11/445620
DATED : May 27, 2008
INVENTOR(S) : Om P. Agrawal et al.

It is certified that error appears in the above-identified patent and that said Letters Patent is hereby corrected as shown below:

Replace sheet 2 of 15 with the following drawing:

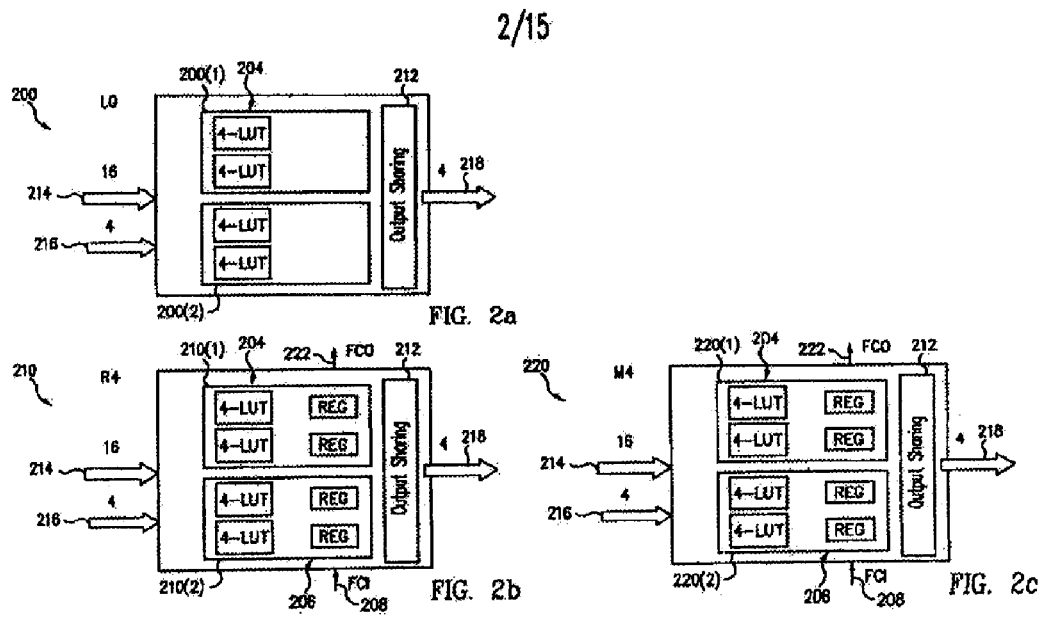

UNITED STATES PATENT AND TRADEMARK OFFICE
CERTIFICATE OF CORRECTION

| | | |
|---|---|---|
| PATENT NO. | : 7,378,872 B1 | Page 5 of 17 |
| APPLICATION NO. | : 11/445620 | |
| DATED | : May 27, 2008 | |
| INVENTOR(S) | : Om P. Agrawal et al. | |

It is certified that error appears in the above-identified patent and that said Letters Patent is hereby corrected as shown below:

Replace sheet 3 of 15 with the following drawing:

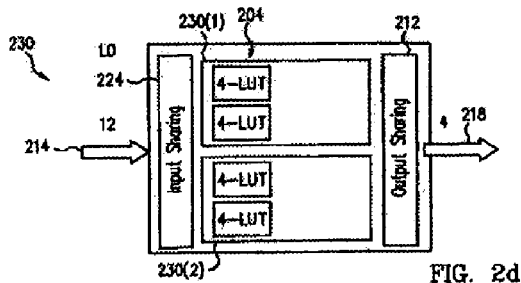

FIG. 2d

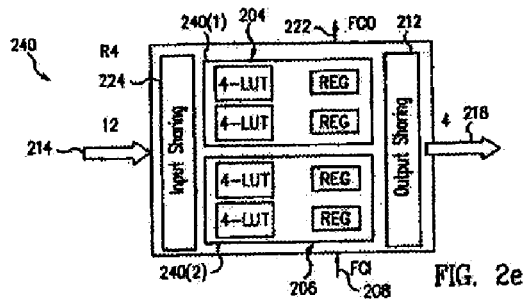

FIG. 2e

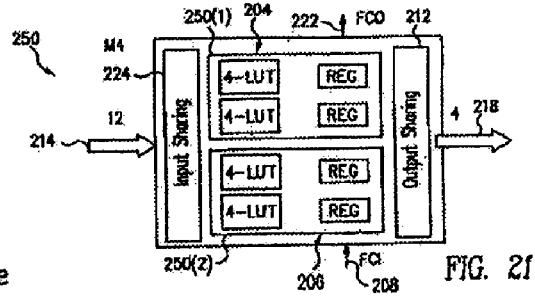

FIG. 2f

UNITED STATES PATENT AND TRADEMARK OFFICE
CERTIFICATE OF CORRECTION

PATENT NO.      : 7,378,872 B1                                              Page 6 of 17
APPLICATION NO. : 11/445620
DATED           : May 27, 2008
INVENTOR(S)     : Om P. Agrawal et al.

It is certified that error appears in the above-identified patent and that said Letters Patent is hereby corrected as shown below:

Replace sheet 4 of 15 with the following drawing:

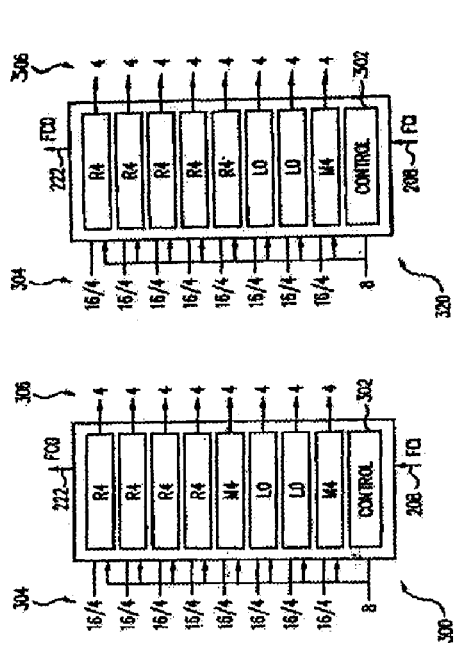
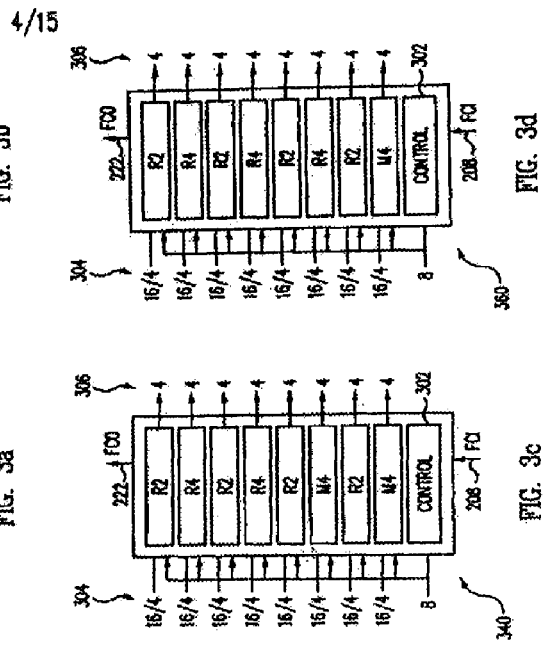
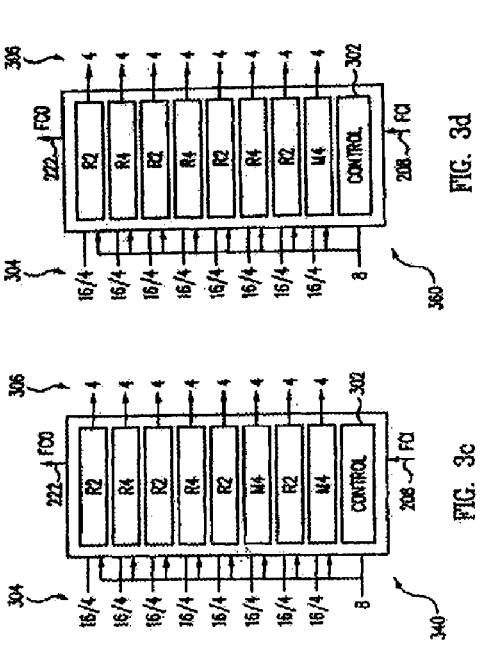

UNITED STATES PATENT AND TRADEMARK OFFICE
CERTIFICATE OF CORRECTION

PATENT NO. : 7,378,872 B1
APPLICATION NO. : 11/445620
DATED : May 27, 2008
INVENTOR(S) : Om P. Agrawal et al.

It is certified that error appears in the above-identified patent and that said Letters Patent is hereby corrected as shown below:

Replace sheet 5 of 15 with the following drawing:

5/15

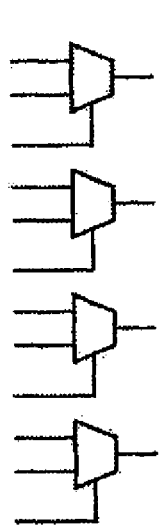 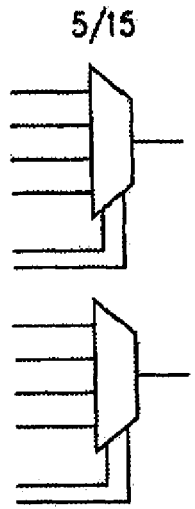 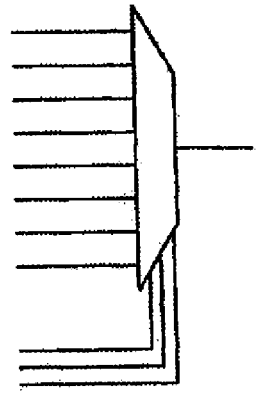

Four Independent 2:1 Muxes    Two Independent 4:1 Muxes    One Independent 8:1 Mux FIG. 4a            FIG. 4b            FIG. 4c

UNITED STATES PATENT AND TRADEMARK OFFICE
CERTIFICATE OF CORRECTION

PATENT NO. : 7,378,872 B1
APPLICATION NO. : 11/445620
DATED : May 27, 2008
INVENTOR(S) : Om P. Agrawal et al.

It is certified that error appears in the above-identified patent and that said Letters Patent is hereby corrected as shown below:

Replace sheet 6 of 15 with the following drawing:

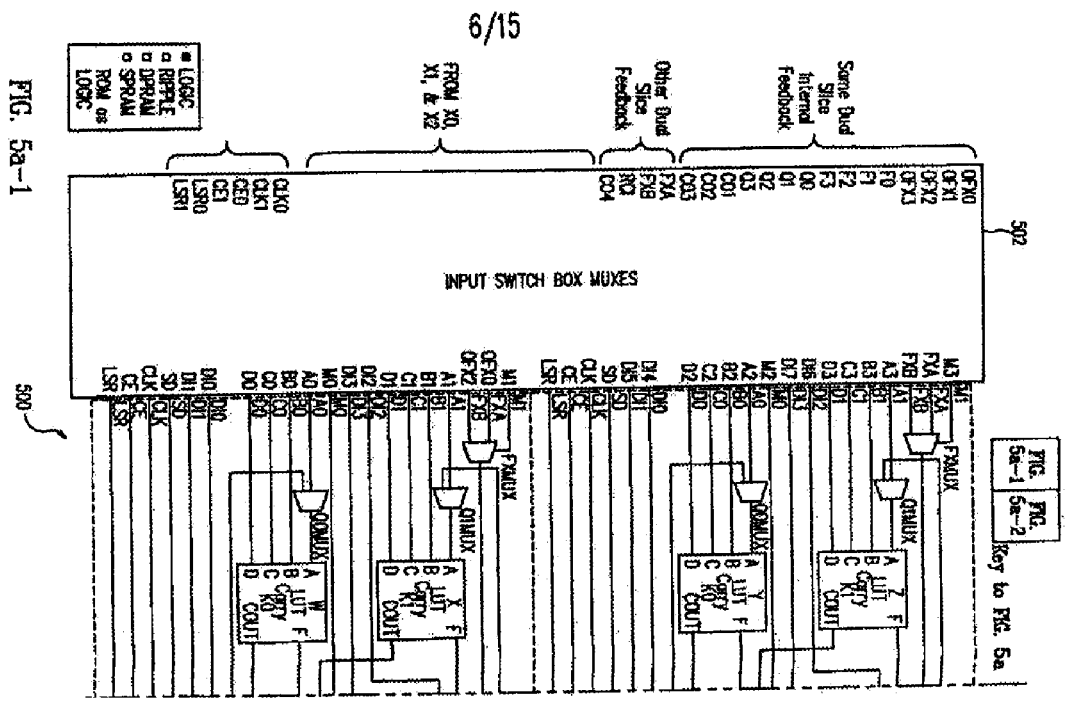

UNITED STATES PATENT AND TRADEMARK OFFICE
CERTIFICATE OF CORRECTION

PATENT NO. : 7,378,872 B1
APPLICATION NO. : 11/445620
DATED : May 27, 2008
INVENTOR(S) : Om P. Agrawal et al.

It is certified that error appears in the above-identified patent and that said Letters Patent is hereby corrected as shown below:

Replace sheet 7 of 15 with the following drawing:

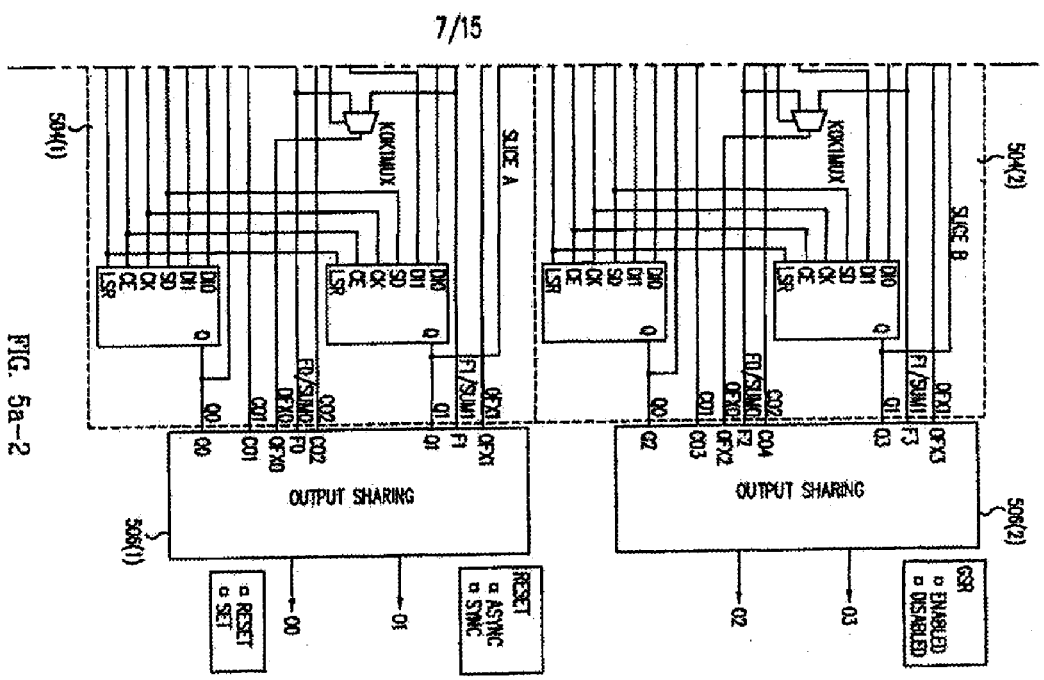

UNITED STATES PATENT AND TRADEMARK OFFICE
CERTIFICATE OF CORRECTION

PATENT NO.         : 7,378,872 B1
APPLICATION NO. : 11/445620
DATED               : May 27, 2008
INVENTOR(S)      : Om P. Agrawal et al.

It is certified that error appears in the above-identified patent and that said Letters Patent is hereby corrected as shown below:

Replace sheet 8 of 15 with the following drawing:

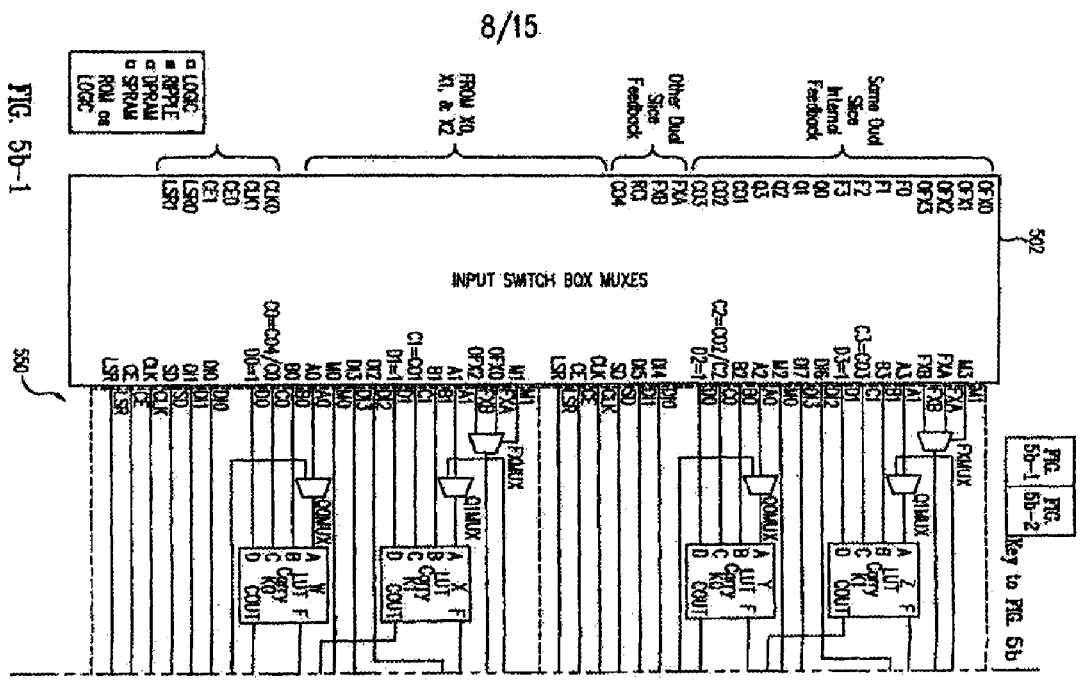

UNITED STATES PATENT AND TRADEMARK OFFICE
CERTIFICATE OF CORRECTION

PATENT NO.       : 7,378,872 B1
APPLICATION NO.  : 11/445620
DATED            : May 27, 2008
INVENTOR(S)      : Om P. Agrawal et al.

It is certified that error appears in the above-identified patent and that said Letters Patent is hereby corrected as shown below:

Replace sheet 9 of 15 with the following drawing:

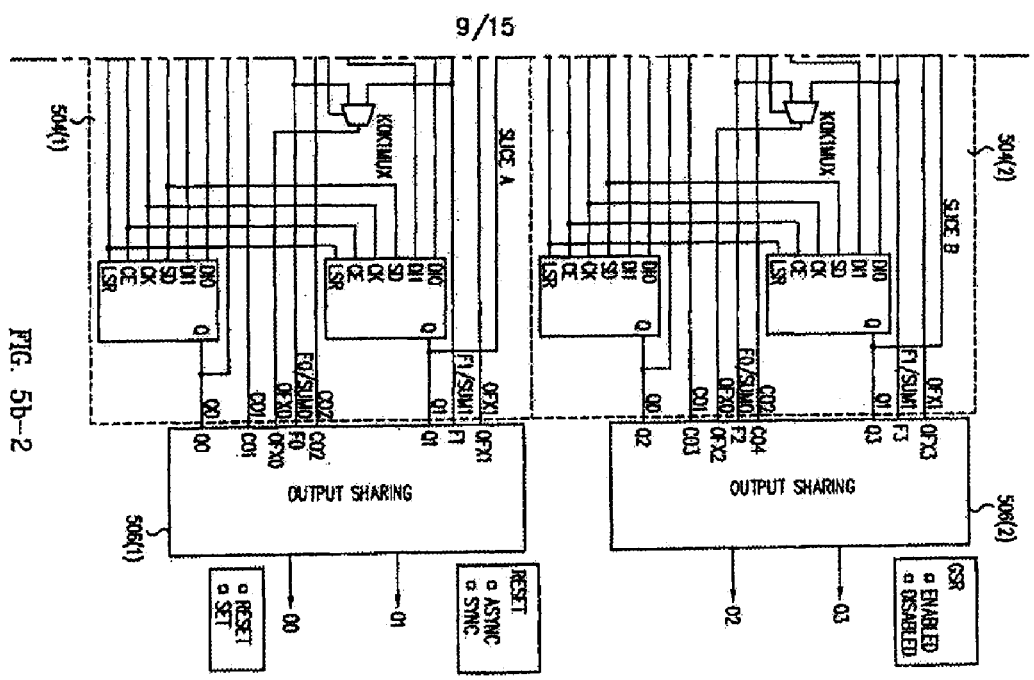

FIG. 5b-2

UNITED STATES PATENT AND TRADEMARK OFFICE
CERTIFICATE OF CORRECTION

| | | |
|---|---|---|
| PATENT NO. | : 7,378,872 B1 | Page 12 of 17 |
| APPLICATION NO. | : 11/445620 | |
| DATED | : May 27, 2008 | |
| INVENTOR(S) | : Om P. Agrawal et al. | |

It is certified that error appears in the above-identified patent and that said Letters Patent is hereby corrected as shown below:

Replace sheet 10 of 15 with the following drawing:

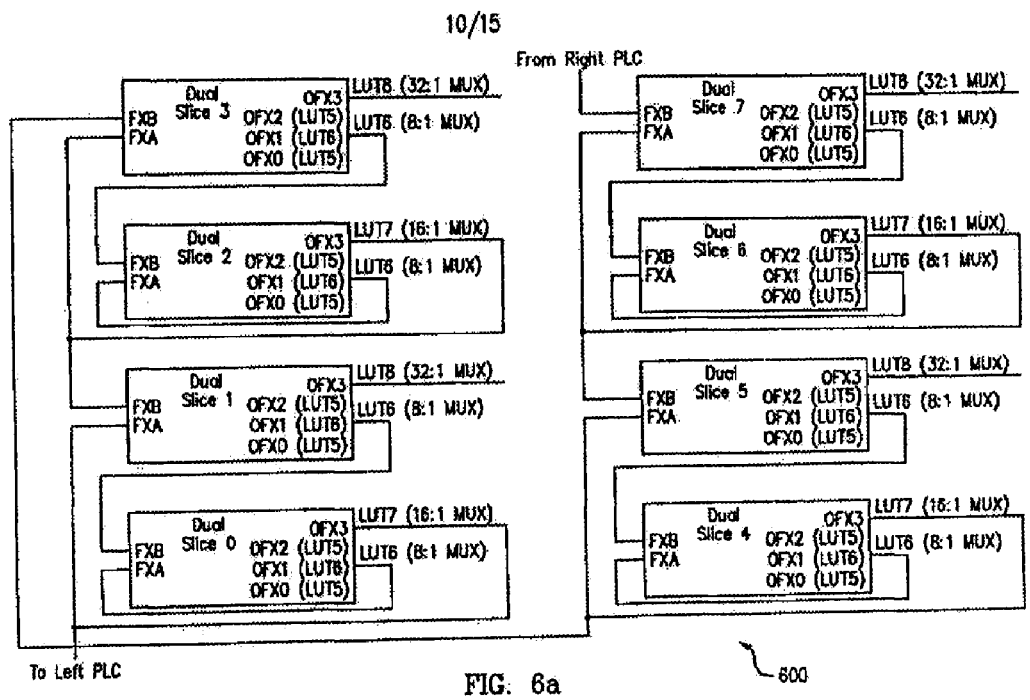

FIG. 6a

UNITED STATES PATENT AND TRADEMARK OFFICE
CERTIFICATE OF CORRECTION

| | | |
|---|---|---|
| PATENT NO. | : 7,378,872 B1 | Page 13 of 17 |
| APPLICATION NO. | : 11/445620 | |
| DATED | : May 27, 2008 | |
| INVENTOR(S) | : Om P. Agrawal et al. | |

It is certified that error appears in the above-identified patent and that said Letters Patent is hereby corrected as shown below:

Replace sheet 11 of 15 with the following drawing:

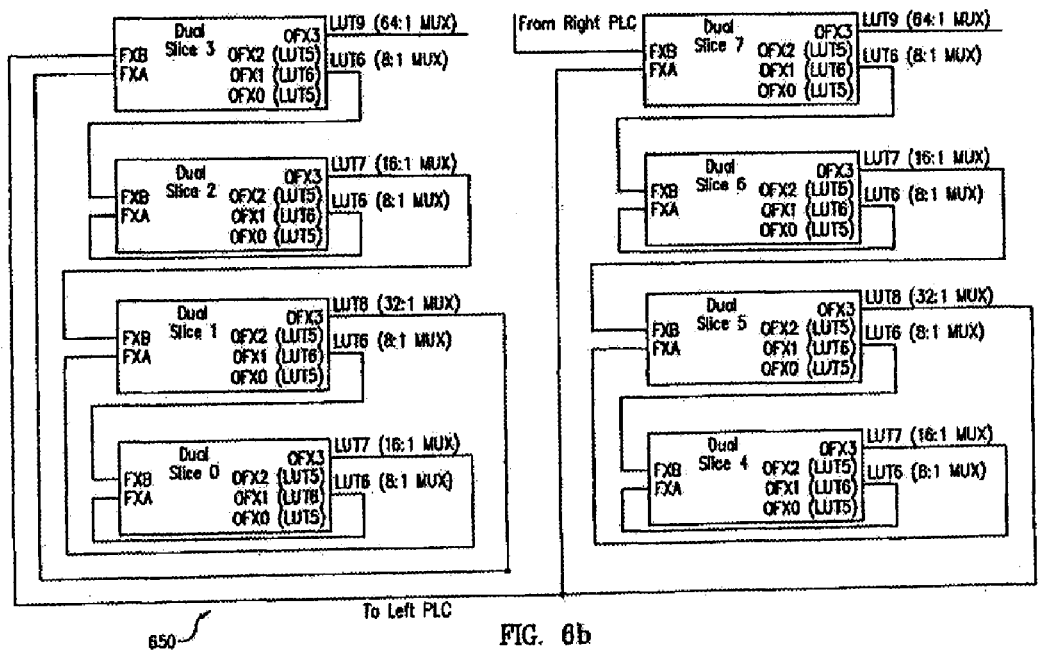

FIG. 6b

UNITED STATES PATENT AND TRADEMARK OFFICE
CERTIFICATE OF CORRECTION

| | | |
|---|---|---|
| PATENT NO. | : 7,378,872 B1 | Page 14 of 17 |
| APPLICATION NO. | : 11/445620 | |
| DATED | : May 27, 2008 | |
| INVENTOR(S) | : Om P. Agrawal et al. | |

It is certified that error appears in the above-identified patent and that said Letters Patent is hereby corrected as shown below:

Replace sheet 12 of 15 with the following drawing:

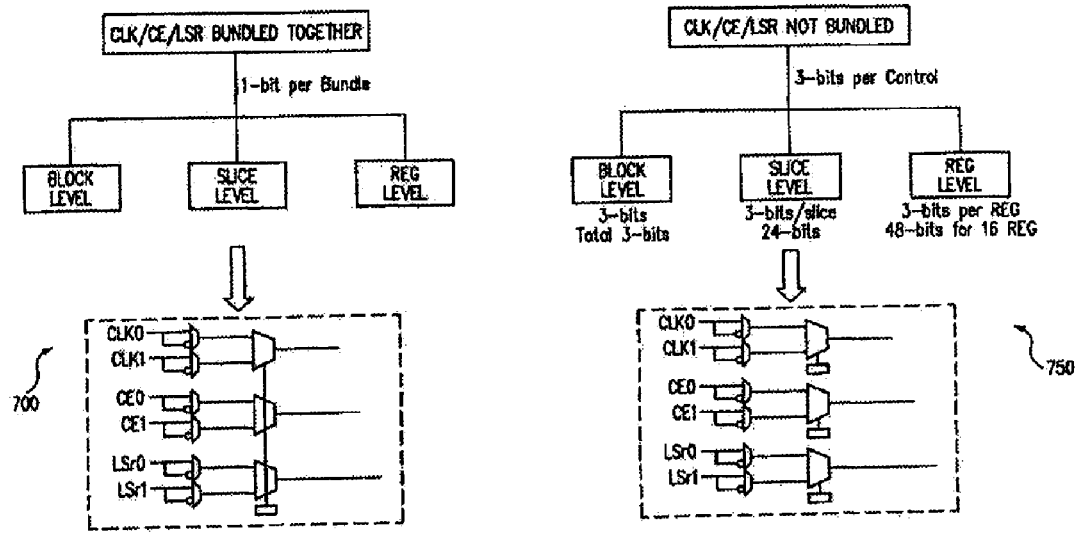

FIG. 7a     FIG. 7b

UNITED STATES PATENT AND TRADEMARK OFFICE
CERTIFICATE OF CORRECTION

PATENT NO. : 7,378,872 B1 Page 15 of 17
APPLICATION NO. : 11/445620
DATED : May 27, 2008
INVENTOR(S) : Om P. Agrawal et al.

It is certified that error appears in the above-identified patent and that said Letters Patent is hereby corrected as shown below:

Replace sheet 13 of 15 with the following drawing:

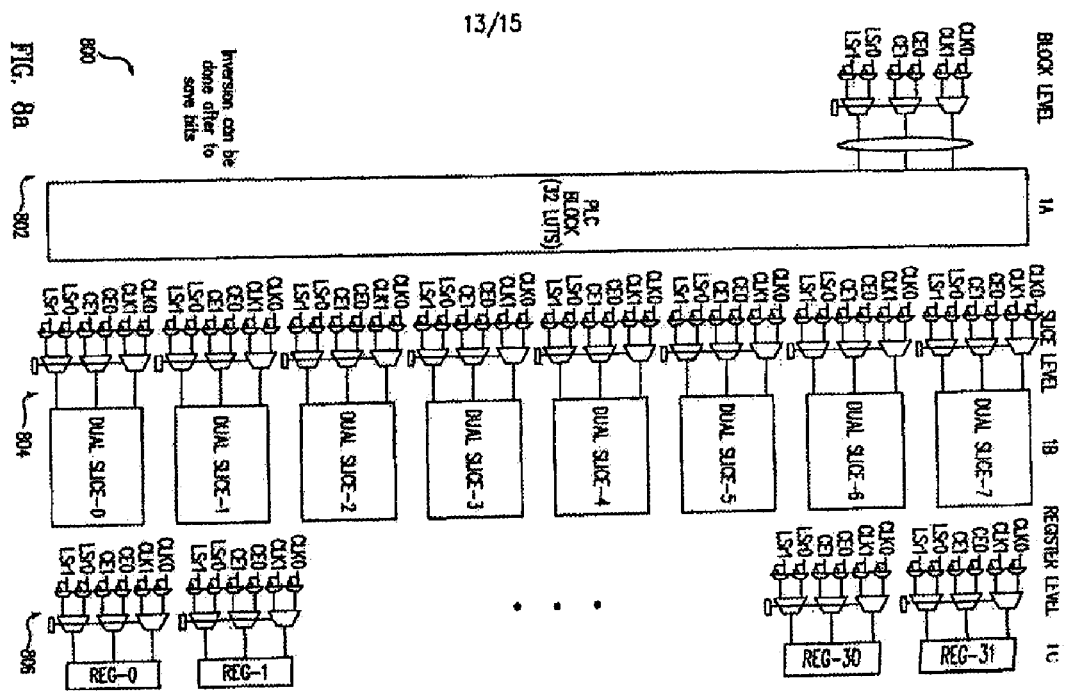

UNITED STATES PATENT AND TRADEMARK OFFICE
CERTIFICATE OF CORRECTION

PATENT NO. : 7,378,872 B1
APPLICATION NO. : 11/445620
DATED : May 27, 2008
INVENTOR(S) : Om P. Agrawal et al.

It is certified that error appears in the above-identified patent and that said Letters Patent is hereby corrected as shown below:

Replace sheet 14 of 15 with the following drawing:

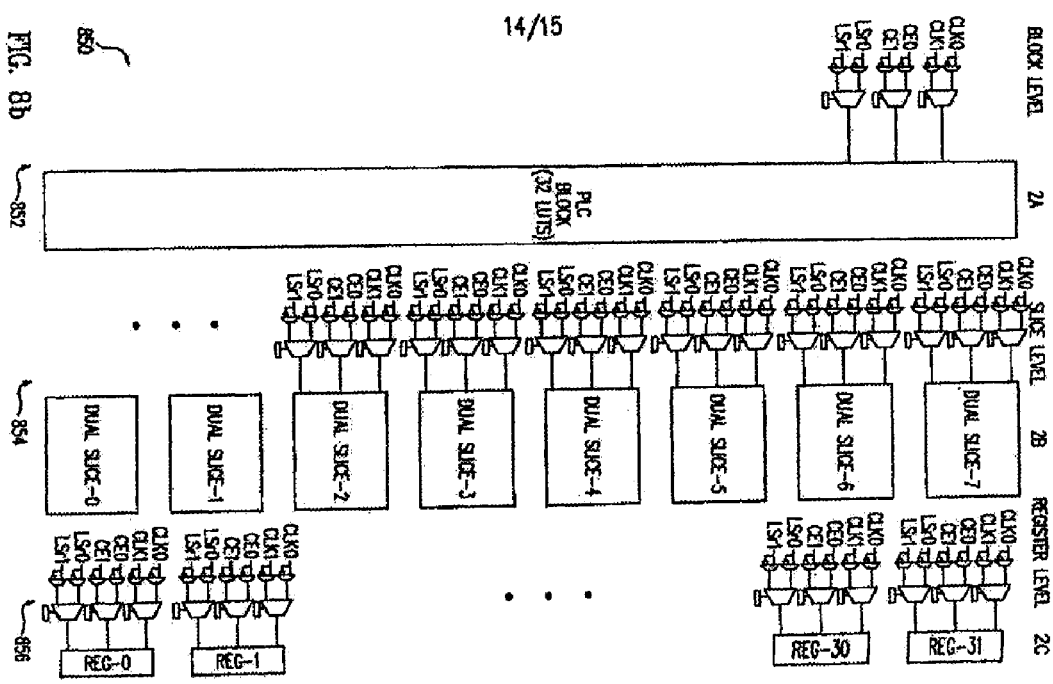

UNITED STATES PATENT AND TRADEMARK OFFICE
CERTIFICATE OF CORRECTION

PATENT NO. : 7,378,872 B1
APPLICATION NO. : 11/445620
DATED : May 27, 2008
INVENTOR(S) : Om P. Agrawal et al.

It is certified that error appears in the above-identified patent and that said Letters Patent is hereby corrected as shown below:

Replace sheet 15 of 15 with the following drawing: